United States Patent
Roohparvar et al.

(10) Patent No.: US 6,504,768 B1
(45) Date of Patent: Jan. 7, 2003

(54) REDUNDANCY SELECTION IN MEMORY DEVICES WITH CONCURRENT READ AND WRITE

(75) Inventors: Frankie F. Roohparvar, Milpitas, CA (US); Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 09/648,661

(22) Filed: Aug. 25, 2000

(51) Int. Cl.$^7$ .............................................. G11C 29/00
(52) U.S. Cl. .................................. 365/200; 365/189.05
(58) Field of Search ........................... 365/200, 189.05, 365/201, 230.08

(56) References Cited

U.S. PATENT DOCUMENTS

| | | |
|---|---|---|
| 5,041,886 A | 8/1991 | Lee |
| 5,257,229 A | 10/1993 | McClure et al. |
| 5,377,146 A | 12/1994 | Reddy et al. |
| 5,537,354 A | 7/1996 | Mochizuki et al. |
| 5,600,605 A | 2/1997 | Schaefer |
| 5,621,690 A | 4/1997 | Jungroth et al. |
| 5,666,321 A | 9/1997 | Schaefer |
| 5,732,030 A | 3/1998 | Dorney |
| 5,734,620 A | 3/1998 | Seyyedy |
| 5,742,549 A | 4/1998 | Ochoa et al. |
| 5,751,039 A | 5/1998 | Kauffman et al. |
| 5,787,097 A | 7/1998 | Roohparvar et al. |
| 5,787,457 A | 7/1998 | Miller et al. |
| 5,808,946 A | 9/1998 | Roohparvar |
| 5,898,627 A | 4/1999 | Yoshikawa |
| 5,910,181 A | 6/1999 | Hatakenaka et al. |
| 5,920,514 A | 7/1999 | Lim et al. |
| 5,936,903 A | 8/1999 | Jeng et al. |
| 5,936,974 A | 8/1999 | Roberts et al. |
| 5,995,438 A | 11/1999 | Jeng et al. |
| 6,018,811 A | 1/2000 | Merritt |
| 6,026,465 A | 2/2000 | Mills et al. |
| 6,077,211 A | 6/2000 | Vo |
| 6,084,807 A | 7/2000 | Choi |
| 6,104,645 A | 8/2000 | Ong et al. |
| 6,134,160 A | 10/2000 | Waller et al. |
| 6,137,133 A | 10/2000 | Kauffman et al. |
| 6,141,247 A | 10/2000 | Roohparvar et al. |
| 6,144,593 A * | 11/2000 | Cowles et al. ............... 365/200 |
| 6,269,035 B1 * | 7/2001 | Cowles et al. ............... 365/200 |

OTHER PUBLICATIONS

Keeth, et al., "DRAM circuit design: a tutorial," IEEE Press, 2001, pp. 16–23, 142–153.
Micron Semiconductor Products, Inc. "2Mb, Smart 5 BIO-S–Optimized Boot Block Flash Memory", *Flash Memory*-www.micron.com, copyright 2000, Micron Technology, Inc., pp. 1–12.
Micron, "16 Mb: x16 SDRAM" *Synchronous DRAM*, www.micron.com, copyright 1999 Micron Technology, Inc., pp. 1–51.

* cited by examiner

*Primary Examiner*—Vu A. Le
(74) *Attorney, Agent, or Firm*—Leffert Jay & Polglaze, P.A.; Thomas W. Leffert

(57) ABSTRACT

Memory devices having redundancy selection circuitry are suited for high-performance memory devices, with particular reference to synchronous non-volatile memory devices capable of concurrent read and write operations. Such memory devices include a redundancy comparator for comparing address signals applied to the memory device to known defective address, and for selecting redundant elements if a match is identified. A redundancy comparator includes at least one redundancy compare latch circuit, each redundancy compare latch circuit having a mapping latch circuit, a read address compare circuit coupled to the mapping latch circuit, and a write address compare circuit coupled to the mapping latch circuit. The read address compare circuit and the write address compare circuit thus share the same mapping latch circuit. Such circuits are capable of simultaneously comparing a read address signal and a write address signal, thus facilitating concurrent read and write operations.

61 Claims, 11 Drawing Sheets

| Left | Pin | Pin | Right |
|---|---|---|---|
| Vcc | 1* | 54 | Vss |
| DQ0 | 2 | 53 | DQ15 |
| VccQ | 3 | 52 | VssQ |
| DQ1 | 4 | 51 | DQ14 |
| DQ2 | 5 | 50 | DQ13 |
| VssQ | 6 | 49 | VccQ |
| DQ3 | 7 | 48 | DQ12 |
| DQ4 | 8 | 47 | DQ11 |
| VccQ | 9 | 46 | VssQ |
| DQ5 | 10 | 45 | DQ10 |
| DQ6 | 11 | 44 | DQ9 |
| VssQ | 12 | 43 | VccQ |
| DQ7 | 13 | 42 | DQ8 |
| Vcc | 14 | 41 | Vss |
| DQML | 15 | 40 | RP# |
| WE# | 16 | 39 | DQMH |
| CAS# | 17 | 38 | CLK |
| RAS# | 18 | 37 | CKE |
| CS# | 19 | 36 | VccP |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

REDUNDANCY SELECTION IN MEMORY DEVICES WITH CONCURRENT READ AND WRITE

TECHNICAL FIELD OF THE INVENTION

The present invention relates generally to semiconductor memory devices, and in particular, the present invention relates to redundancy selection in non-volatile semiconductor memory devices having concurrent read and write capabilities.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Asynchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

Memory access speeds can further be improved through the use of concurrent operations. In this manner, the memory device begins performing one operation before a previous operation is completed. Implementation of concurrent operations may introduce problems in redundancy selection.

Redundancy is a method of incorporating spare or redundant devices on a semiconductor die that can be used to replace defective devices. Redundancy is widely used in high density memory devices to improve production yield. As an example, a memory device may have redundant elements, such as redundant memory cells, redundant rows of memory cells or redundant columns of memory cells. If a primary element is determined to be defective, the defective element may be replaced by a redundant element by redirecting the address of the defective element to the redundant element in a manner known in the art. By replacing the defective element, an otherwise unusable memory device becomes commercially acceptable. In devices supporting concurrent operations, selection of a redundant element for a read operation cannot interfere with selection of the redundant element for a write operation, and vice versa.

For the reasons stated above, and for other reasons stated below which will become apparent to those skilled in the art upon reading and understanding the present specification, there is a need in the art for alternate integrated circuits to facilitate selection of redundant elements in semiconductor memory devices having the capability for concurrent read and write operations.

SUMMARY OF THE INVENTION

The above-mentioned problems with memory devices and other problems are addressed by the present invention and will be understood by reading and studying the following specification.

Memory devices having redundancy selection circuitry are described herein, with particular reference to synchronous non-volatile memory devices capable of concurrent read and write operations. Such memory devices are suited for high-performance applications. The memory devices include a redundancy comparator for comparing address signals applied to the memory device to known defective address, and for selecting redundant elements if a match is identified. A redundancy comparator includes at least one redundancy compare latch circuit, each redundancy compare latch circuit having a mapping latch circuit, a read address compare circuit coupled to the mapping latch circuit, and a write address compare circuit coupled to the mapping latch circuit. The read address compare circuit and the write address compare circuit thus share the same mapping latch circuit. Such circuits are capable of simultaneously comparing a read address signal and a write address signal, thus facilitating concurrent read and write operations.

For one embodiment, the invention provides a redundancy compare latch circuit. The redundancy compare latch circuit includes a mapping latch circuit coupled to receive and latch a fuse data signal, a read address compare circuit coupled to receive a read address signal and further coupled to the mapping latch circuit to receive the latched fuse data signal, and a write address compare circuit coupled to receive a write address signal and further coupled to the mapping latch circuit to receive the latched fuse data signal. The read address compare circuit provides a read address match signal having a first logic level when the read address signal matches the latched fuse data signal and a second logic level when the read address signal differs from the latched fuse data signal. The write address compare circuit provides a write address match signal having the first logic level when the write address signal matches the latched fuse data signal and the second logic level when the write address signal differs from the latched fuse data signal.

For another embodiment, the invention provides a redundancy compare latch circuit. The redundancy compare latch circuit includes a mapping latch circuit coupled to a first signal node, a second signal node, and a third signal node. The mapping latch circuit is responsive to a first control signal on the first signal node to receive and latch a fuse data signal from the second signal node. The mapping latch circuit is responsive to a second control signal on the third signal node to provide the latched fuse data signal to the second signal node. The redundancy compare latch circuit further includes a read address compare circuit coupled to receive a read address signal and further coupled to the mapping latch circuit to receive the latched fuse data signal. The redundancy compare latch circuit further includes a write address compare circuit coupled to receive a write address signal and further coupled to the mapping latch circuit to receive the latched fuse data signal. The read address compare circuit provides a read address match signal having a first logic level when the read address signal matches the latched fuse data signal and a second logic level when the read address signal differs from the latched fuse data signal. The write address compare circuit provides a write address match signal having the first logic level when the write address signal matches the latched fuse data signal and the second logic level when the write address signal differs from the latched fuse data signal.

For a further embodiment, the invention provides a redundancy compare latch circuit. The redundancy compare latch circuit includes a mapping latch circuit coupled to a first signal node for receiving a first control signal, a second signal node for receiving a second control signal that is a complement of the first control signal, and a third signal node for receiving a fuse data signal. The mapping latch circuit includes a first inverter and a second inverter, wherein the output of the first inverter is coupled to the input of the second inverter. The mapping latch circuit further includes a first pass gate coupled between the third signal node and the input of the first inverter, wherein the first pass gate has a field effect transistor of a first polarity having a gate coupled to the first signal node and a field effect transistor of a second polarity having a gate coupled to the second signal node. The mapping latch circuit further includes a second pass gate coupled between the output of the second inverter and the input of the first inverter, wherein the second pass gate has a field effect transistor of the first polarity having a gate coupled to the second signal node and a field effect transistor of the second polarity having a gate coupled to the first signal node. The redundancy compare latch circuit further includes a read address compare circuit having a first input coupled to a fourth signal node to receive a read address signal, a second input coupled to at least the output of the second inverter, and an output. The read address compare circuit provides on its output a read address match signal having a first logic level when the read address signal matches a logic level at the output of the second inverter and a second logic level when the read address signal differs from the logic level at the output of the second inverter. The redundancy compare latch circuit further includes a write address compare circuit having a first input coupled to a fifth signal node to receive a write address signal, a second input coupled to at least the output of the second inverter, and an output, wherein the write address compare circuit provides on its output a write address match signal having the first logic level when the write address signal matches the logic level at the output of the second inverter and the second logic level when the write address signal differs from the output of the second inverter.

The invention further provides methods and apparatus of varying scope.

BRIEF DESCRIPTION OF THE DRAWINGS

FIG. 2A is a top view of a memory assembly showing a package pin assignment diagram in accordance with the invention.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

As the invention relates to selection of redundant elements in a memory device, the following description is set forth in two sections. The first section, with reference to FIGS. 1–4, describes a memory device and redundancy structure suited for use with the invention. A more detailed description of such memory devices may be found in U.S. patent application Ser. No. 09/642,341 filed Aug. 21, 2000 and titled, "Multiple Bit Line Column Redundancy", which is commonly assigned. The second section describes circuitry associated with the selection of redundant elements and their operation, with specific reference to such memory devices described with reference to FIGS. 1–4. However, the invention is not limited to such memory devices.

Memory Device and Redundancy Structure

Figure 1:
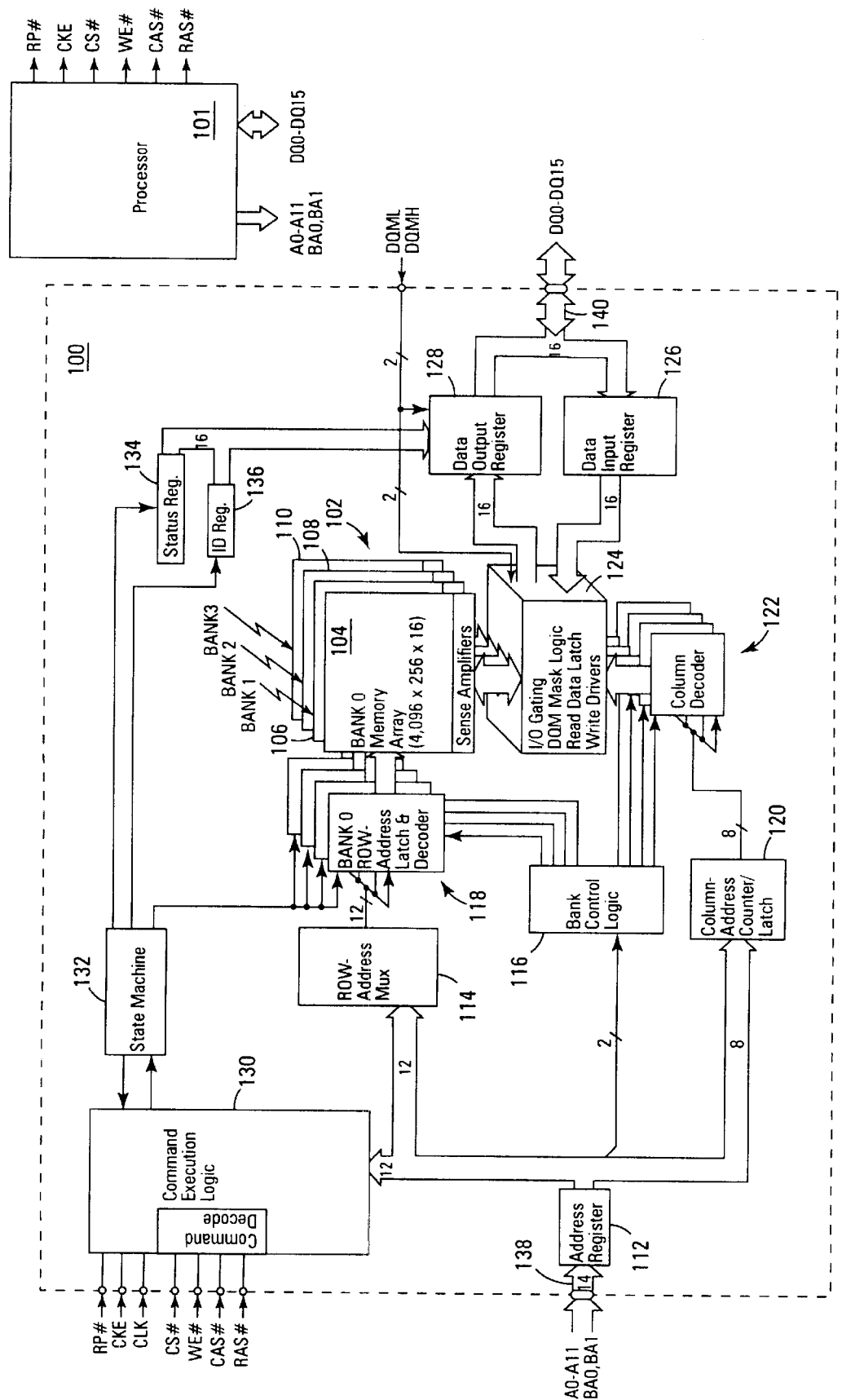
FIG. 1 is a block diagram of a memory device in accordance with the invention.

FIG. 1 is a block diagram of one embodiment of a synchronous memory device in accordance with the invention. The memory device 100 includes at least one redundancy compare latch circuit (not shown in FIG. 1) as described below. The memory device 100 includes an array of non-volatile flash memory cells 102. All access commands to the array 102 of the memory device 100 are synchronized to a system clock input signal (CLK), thus the memory device 100 may be referred to as a synchronous flash memory device or synchronous non-volatile memory device. However, the invention is not limited to synchronous or non-volatile memory devices, nor is it limited to memory devices having a column redundancy structure as described herein.

The array 102 is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. The row address multiplexer circuitry 114, the bank control logic 116, the row address latch and decode circuitry 118, the column address counter and latch circuitry 120 and the column decode circuitry 122 can collectively be referred to as addressing circuitry. An address applied to the memory device 100, and thus the memory array 102, is decoded and directed to a target memory cell through such circuits to address, and thus access, the target memory cell. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 1 may be fabricated on a substrate, such as a semiconductor wafer, and may be referred to as a memory chip.

FIG. 2A illustrates an interconnect pin assignment of one embodiment of the present invention as a memory assembly having a pin layout substantially similar to an industry standard SDRAM 54-pin TSOP (thin small-outline package) package. Accordingly, the memory assembly has a memory package 150 having 54 interconnect pins and a memory device (not shown) in accordance with the invention. The memory device is contained in the memory package 150. The address inputs, data inputs/outputs, power inputs and clock and control signal inputs of the memory device are coupled to their respective portions of the interconnect pins of the memory package 150 in a conventional manner. Two interconnects shown in the embodiment of FIG. 2A and not present in standard SDRAM packages include control signal RP# and power input VccP. Although knowledge of the function of the various clock and control signals and the various power inputs is not essential to understanding the present invention, a detailed discussion is included in U.S. Pat. application Ser. No. 09/567,733 filed May 10, 2000 and titled, "Flash with Consistent Latency," which is commonly assigned.

Figure 2B:
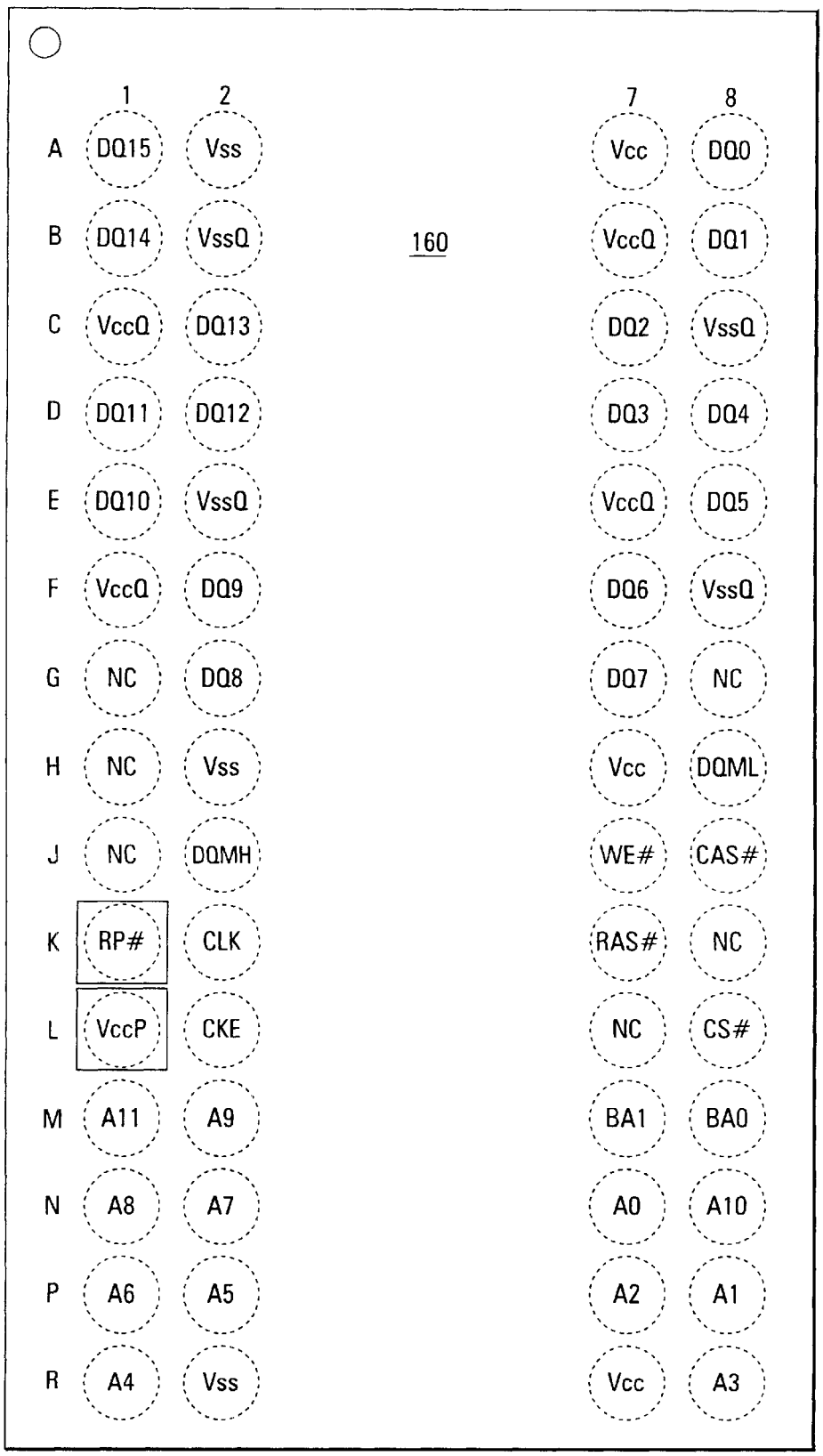
FIG. 2B is a top view of a memory assembly showing a package bump assignment diagram in accordance with the invention.

FIG. 2B illustrates a bump assignment of one embodiment of the present invention as a memory assembly having a bump layout substantially similar to an industry standard SDRAM 60-bump FBGA (fine-pitch ball grid array) package. Memory package 160 is generally similar to memory package 150 except that the interconnects of memory package 160 have bump connections instead of the pin connections of memory package 150. The present invention, therefore, is not limited to a specific package configuration. Furthermore, the invention is not limited to memory packages having pin or bump layouts substantially similar to the interconnect layout of an industry-standard SDRAM package, but is applicable to other memory packages having memory devices containing arrays having an organization with column redundancy in accordance with the various embodiments of the invention.

Figure 3:
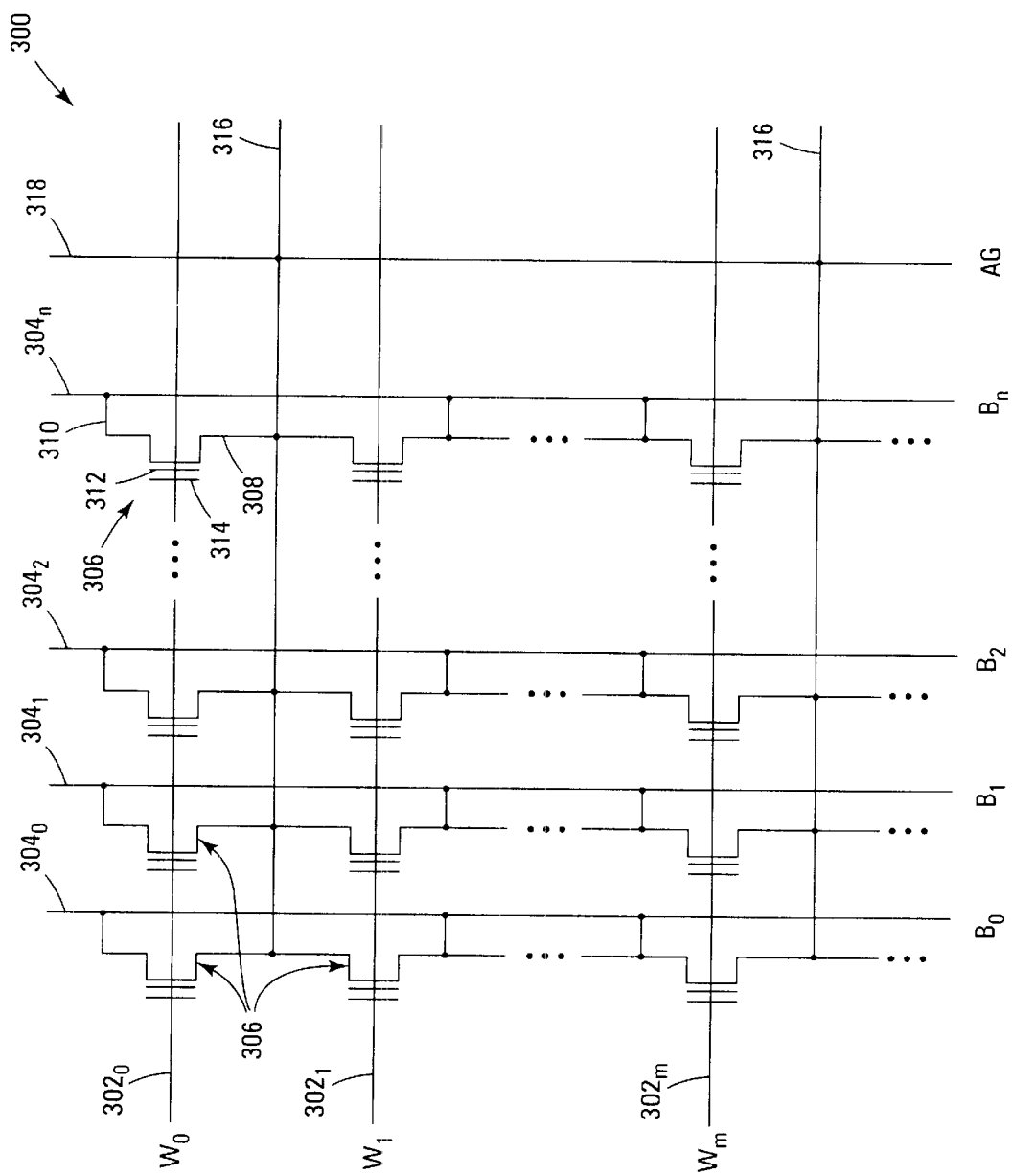
FIG. 3 is a schematic of a portion of a memory block in accordance with one embodiment of the invention.

Arrays of non-volatile memory cells are often configured as floating gate transistors placed at the intersection of word lines and bit lines. The word lines are coupled to the control gates of the floating gate transistors. FIG. 3 is a schematic of a portion of a non-volatile memory block 300 as a portion of a memory array 102 in accordance with one embodiment of the invention.

The detail of memory block 300 is provided to better understand the various embodiments of the invention. However, the invention is not limited to the specific floating-gate memory cell and layout described with reference to FIG. 3.

As shown in FIG. 3, the memory block 300 includes word lines 302 and intersecting local bit lines 304. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown in FIG. 3) in a many-to-one relationship such that no more than one local bit line 304 provides electrical communication between a memory cell and any given global bit line in normal operation, with memory cells associated with the remaining local bit lines 304 being electrically isolated from that global bit line.

Floating gate transistors 306 are located at each intersection of a word line 302 and a local bit line 304. The floating gate transistors 306 represent the non-volatile memory cells for storage of data. Typical construction of such floating gate transistors 306 include a source 308 and a drain 310 constructed from an $N^+$-type material of high impurity concentration formed in a P-type semiconductor substrate of low impurity concentration, a channel region formed between the source and drain, a floating gate 312, and a control gate 314. Floating gate 312 is isolated from the channel region by a tunneling dielectric and from the control gate 314 by an intergate dielectric. The materials of construction are not critical to the invention, but commonly include doped polysilicon for the gate materials, and silicon oxides, nitrides or oxynitrides for the dielectric materials. Floating gate transistors 306 having their control gates 314 coupled to a word line 302 typically share a common source 308 depicted as array source 316. As shown in FIG. 3, floating gate transistors 306 coupled to two adjacent word lines 302 may share the same array source 316. Floating gate transistors 306 have their drains 310 coupled to a local bit line 304. A column of the floating gate transistors 306 are those transistors commonly coupled to a given local bit line 304. A row of the floating gate transistors 306 are those transistors commonly coupled to a given word line 302.

To reduce problems associated with high resistance levels in the array source 316, the array source 316 is regularly coupled to a metal or other highly conductive line to provide a low-resistance path to ground. The array ground 318 serves as this low-resistance path.

Figure 4:
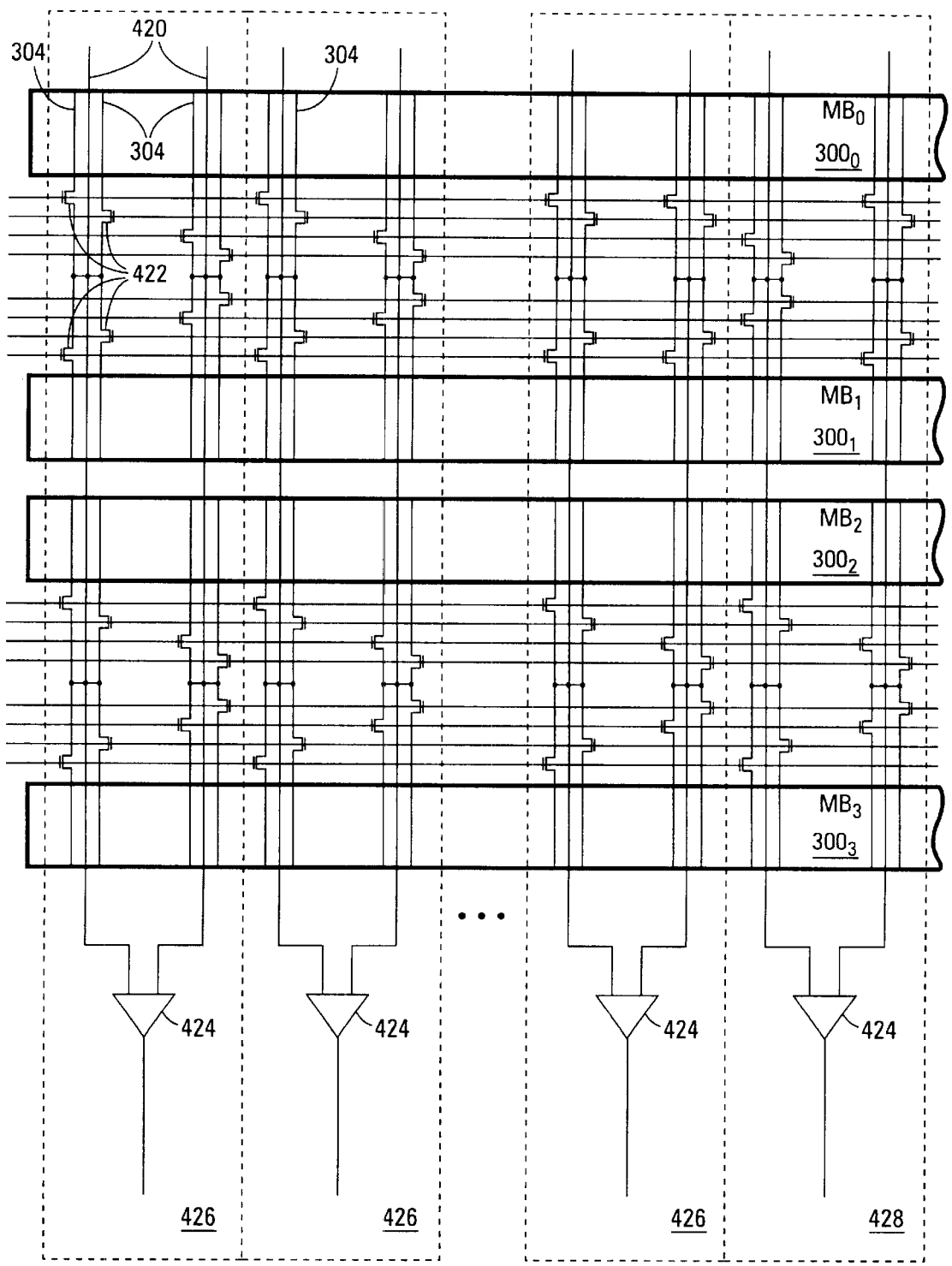
FIG. 4 is a schematic of a portion of a memory sector in accordance with one embodiment of the invention.

FIG. 4 is a schematic of a portion of a memory sector 400 in accordance with one embodiment of the invention. In FIG. 4, certain detail and reference numbers are omitted in the interest of clarity. The omitted detail is apparent from the context of use with reference to FIG. 3.

The portion of a memory sector 400 as depicted in FIG. 4 shows the coupling of local bit lines 304 of a memory block 300 to global bit lines 420 of the memory sector 400. The memory sector 400 includes at least one and preferably two or more memory blocks 300. For ease of addressing, the number of memory blocks 300 included in a memory sector 400 is generally some power of two, and each memory block 300 preferably has the same number of rows and columns. In the embodiment of FIG. 4, memory sector 400 includes four memory blocks $300_0$, $300_1$, $300_2$ and $300_3$ identified as main blocks MB0, MB1, MB2 and MB3, respectively. Each memory block 300 has a row and column organization as generally described with reference to FIG. 3. In the interest of clarity, individual memory cells are not shown in FIG. 4. To couple an individual memory cell to a sense amplifier 424, its associated word line is activated, thus activating the target memory cell as well as other memory cells associated with the word line. Note that to simplify access circuitry, word lines may be simultaneously activated in more than one memory block 300. The local bit line 304 associated with the target memory cell is then actively coupled to an associated global bit line 420 such as by activating its block pass transistor 422 such that other local bit lines 304 associated with the global bit line 420 (and not used for referencing as described below) are electrically isolated from the global bit line 420 with deactivated block pass transistors 422. As used herein, actively coupled indicates electrical communication between the coupled elements. Selectively coupled indicates that coupled elements are selectively in a state of electrical communication or electrical isolation.

Block pass transistors 422 are activated in response to control signals from the row and column decoder circuits indicative of the target memory cell. Note that multiple local bit lines 304 may be simultaneously actively coupled to multiple associated global bit lines 420 in a one-to-one relationship to read multiple data bits in the same read operation. Memory cells whose word lines are deactivated or memory cells associated with local bit lines 304 not actively coupled to a global bit line 420 are ignored, i.e., such memory cells are electrically isolated from a sensing device.

As shown in FIG. 4, eight local bit lines 304, two from each block 300, are coupled to each global bit line 420 through selective coupling devices, such as block pass transistors 422, with each global bit line 420 extending to two or more blocks 300. The local bit lines 304 are electrically isolated from each global bit line 420 until their associated selective coupling devices are activated. Global bit lines 420 are coupled in pairs to the sense amplifiers 424. Each pair of global bit lines 420 defines a first side, or sensing side, of the sense amplifier 424 and a second side, or reference side, of the sense amplifier 424. The sensing side of the sense amplifier is the side coupled to the target memory cell. Note that there are no intervening sensing devices between a local bit line 304 and its associated global bit line 420. Furthermore, the set of local bit lines 304 associated with one side of a sense amplifier 424 is mutually exclusive from the set of local bit lines 304 associated with the other side of the sense amplifier 424.

For the embodiment depicted in FIG. 4, there is one sense amplifier 424 located in the span of every four local bit lines 304. By coupling each sense amplifier 424 to more than two local bit lines 304, the memory block 300 can make use of tighter packing of memory cells and local bit lines 304. To couple each sense amplifier 424 to only two local bit lines 304, the spacing of the local bit lines 304 may need to increase, the dimensions of the sense amplifiers 424 may need to decrease, or the sense amplifiers 424 may need to be staggered on each end of the memory sector 400; each case, however, would generally lead to a detrimental increase in die size or a detrimental reduction in signal drive by the sense amplifiers 424.

While four memory blocks 300 are depicted in FIG. 4, additional memory blocks 300 could be coupled to the global bit lines 420 by extending the global bit lines 420 to the additional memory blocks 300. Note that there is no requirement that the global bit lines 420 extend across the memory block 300 farthest from the sense amplifiers (memory block $300_0$ in the embodiment of FIG. 4); a global bit line 420 need only extend to a point of coupling to the block pass transistors used to couple the global bit line 420 to its associated local bit lines 304.

During a read or sensing operation, a first local bit line 304 coupled to the target memory cell is actively coupled to its associated global bit line 420 through its block pass transistor 422 on the sensing side of a sense amplifier 424. To balance capacitance on each side of the sense amplifier 424 during a sensing operation, a second local bit line 304 is concurrently actively coupled to its associated global bit line 420 through its block pass transistor 422 on the reference side of the sense amplifier 424. The second local bit line 304 is electrically floating such that no memory cells are actively coupled to the second local bit line 304. Balancing the capacitance on each side of the sense amplifier 424 is preferred to improve the reliability of the sensing operation. Additional reference bit lines may be used, including floating bit lines on the sensing side of the sensing device.

In the architectures thus described, a defect associated with one local bit line 304 will generally affect more than its associated column of memory cells. As an example, a defect associated with a local bit line 304 will risk erroneous data sensing whether the defective local bit line 304 is associated with the target memory cell or whether the defective local bit line 304 is used to balance capacitance on the reference side of a sense amplifier 424. It is known in the art that defective memory cells can be replaced with redundant memory cells. For example, a column of memory cells containing a defect may be replaced by a redundant column of memory cells. However, such replacement is complicated in architectures of the type described with reference to FIG. 4, where multiple local bit lines 304 are associated with each side of a sense amplifier 424.

For one embodiment, column redundancy is effected by providing a redundant sense amplifier 424, and associated global bit lines 420, local bit lines 304 and memory cells. For this embodiment, a defect associated with one primary grouping of memory cells 426 can be repaired by redirecting addressing for the defective primary grouping of memory cells 426 to a redundant grouping of memory cells 428. Thus, any access request, such as a read or write request, to a memory cell in the defective primary grouping of memory cells 426 is redirected to a memory cell in the redundant grouping of memory cells 428, regardless of whether the memory cell in the defective primary grouping of memory cells 426 is itself defective or is itself coupled to a local bit line 304 associated with a defect. Each grouping of memory cells 426, 428 contains a sense amplifier 424 and a pair of global bit lines 420, along with their associated local bit lines 304 and coupled memory cells. For one embodiment, there is one redundant grouping of memory cells 428 for every 256 primary groupings of memory cells 426. While increasing the ratio of redundant groupings of memory cells 428 to the primary groupings of memory cells 426 increases the likelihood of repairing every defective column of memory cells within the memory device, it also detrimentally increases the die real estate. Accordingly, this ratio should be balanced against the likelihood of defects and the costs of increased die size.

Redundancy Selection

In general, redundancy selection involves comparing an applied memory cell location address with a known defective address; generating a match signal indicative of whether the applied address matches the known defective address; deactivating, suppressing or otherwise ignoring access circuitry for the primary element associated with the known defective address; and activating or otherwise accessing a redundant element designated to replace the primary element associated with the known defective address. The known defective address is identified during testing of the memory device and is generally programmed into a mapping circuit, such as a fuse-type circuit or other non-volatile storage device. In a fuse-type circuit, a blown fuse can represent a first binary value, such as logic 1, and an un-blown fuse can represent a second binary value, such as logic 0. A flash memory cell may further be used as the non-volatile storage device, the operation of which is generally described with reference to FIG. 3. For simplicity, the non-volatile storage devices of the mapping circuit will be referred to as fuses, whether the non-volatile storage device is one-time programmable, such as a fusible link device, or re-programmable, such as a flash memory cell. Comparison of the applied address is generally carried out bit-by-bit with the binary values of the fuses. If all the corresponding bits of the applied address match the binary values of the fuses, a match is detected and the primary element (or primary grouping of memory cells) is replaced by the redundant element (or redundant grouping of memory cells) associated with the mapping circuit.

For concurrent read and write operations in a memory device, a write operation may begin as soon as row data is latched into the sensing devices and before its subsequent output to the data output register. To facilitate this, the address bus is divided into a write address bus for communication of write addresses, and a read address bus for communication of read addresses. For row redundancy, a compare circuit can point to the read address bus for comparison of the read address signals until the row data is latched in the sensing devices, then point to the write address bus for comparison of the write address signals. Column redundancy, however, is complicated by the need for read and write column redundancy selection to remain simultaneously active; for at least a portion of time during a transition between read and write operations, column redundancy selection circuitry may simultaneously point to a first column of memory cells for the read operation and a second column of memory cells for the write operation. The various embodiments of the invention address this difficulty.

Figure 5:
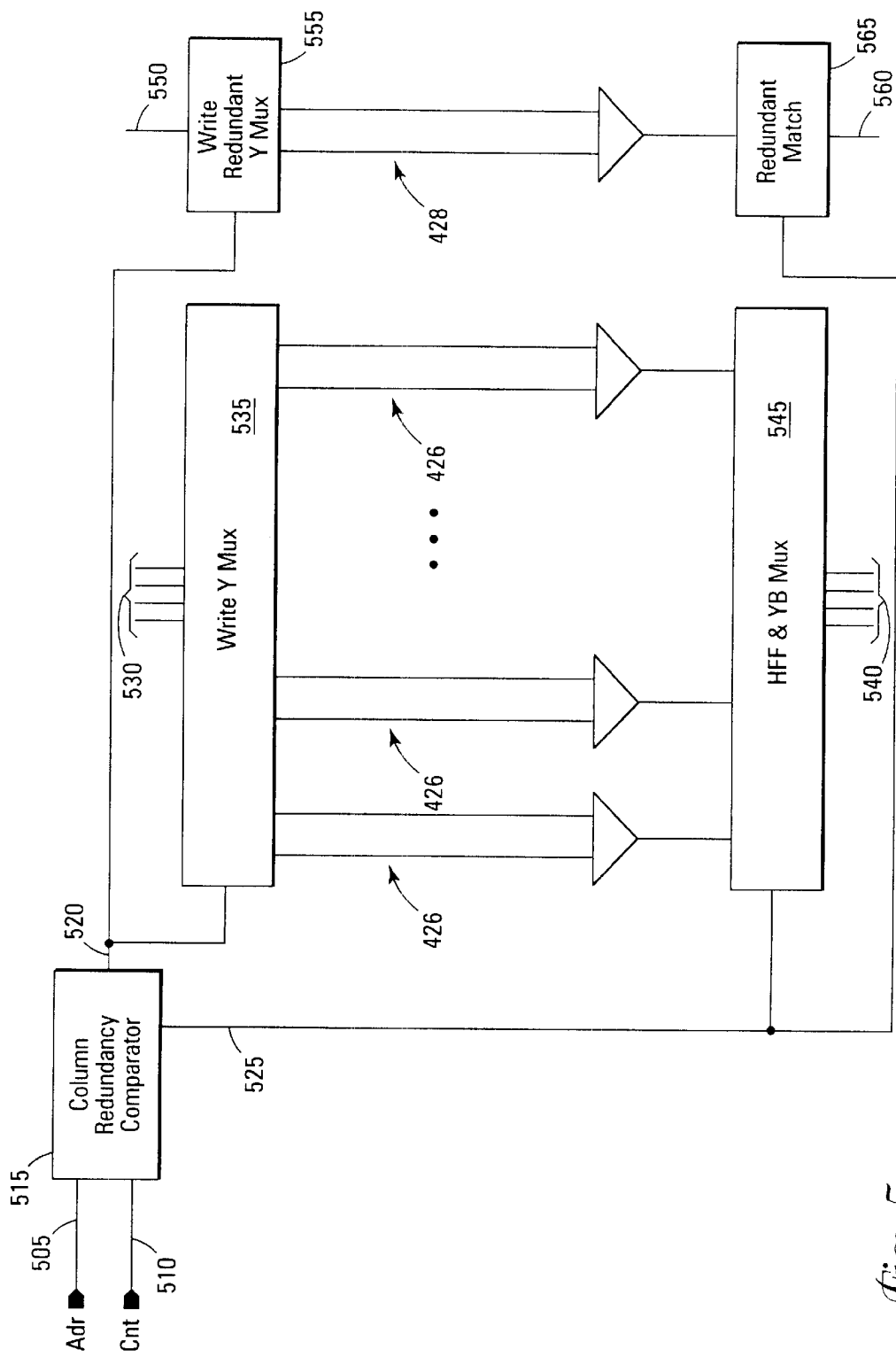
FIG. 5 is a schematic of a redundancy comparator coupled to a memory array in accordance with one embodiment of the invention.

FIG. 5 is a schematic depicting one embodiment of a redundancy comparator coupled to a memory array to facilitate concurrent read and write operations in a memory device. The redundancy comparator depicted in FIG. 5 may generally be a portion of the column decode circuitry 122 of the memory device 100. While the redundancy comparator depicted in FIG. 5 compares column addresses, redundancy comparators in accordance with the various embodiments of the invention are suitable for row redundancy as well.

As shown in FIG. 5, the read address bus 505 for communicating the read address signal Adr and the write address bus 510 for communicating write address signal Cnt are input to the redundancy comparator 515. Redundancy comparator 515 provides at least two outputs including write match signal CntMatch on signal line 520 and read match signal AdrMatch on signal line 525. Write match signal CntMatch is indicative of whether the address applied to the write address bus 520 matches a known defective address associated with a primary grouping of memory cells 426. Read match signal AdrMatch is indicative of whether the address applied to the read address bus 525 matches a known defective address associated with the primary grouping of memory cells 426. Write Y Mux 535 and Write Redundant Y Mux 555 are responsive to the write match signal CntMatch and the write address signal Cnt to select between, and drive, the appropriate write data inputs 530 and/or write redundant data inputs 550 for input to their respective primary groupings of memory cells 426 and/or redundant groupings of memory cells 428. HFF (Helper Flip-Flops) & YB Mux 545 and Redundant Match Circuit 565 are responsive to the read match signal AdrMatch and the read address signal Adr to select between, and sense, the appropriate read data outputs 540 and/or read redundant data outputs 560 for output from their respective primary groupings of memory cells 426 and/or redundant groupings of memory cells 428. Read data outputs 540 and redundant read data outputs 560 may be further multiplexed prior to output to the data output register of the memory device.

Figure 6:
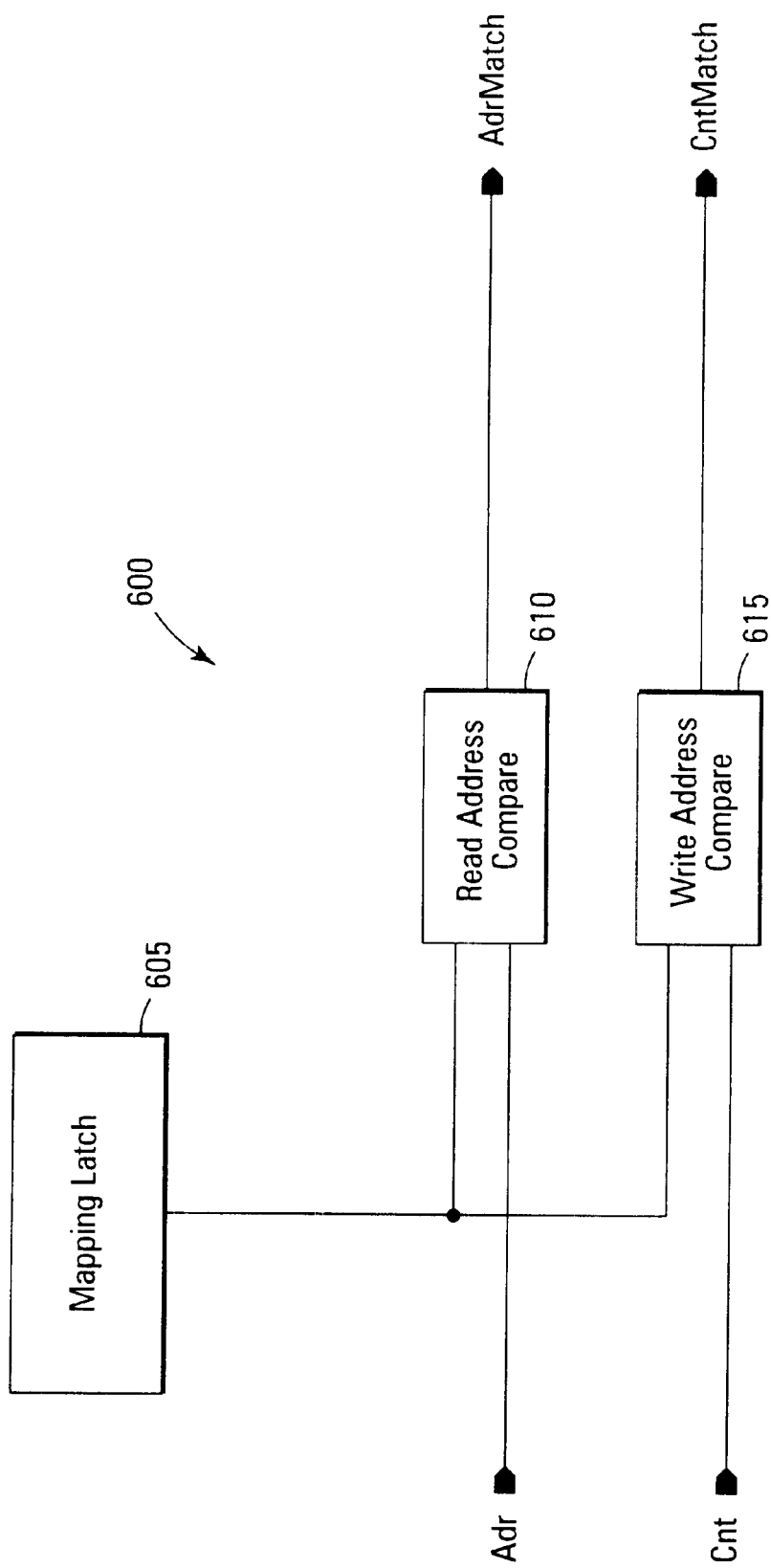
FIG. 6 is a schematic of a redundancy compare latch circuit in accordance with one embodiment of the invention.

Redundancy comparators 515 in accordance with the invention use the same mapping latch circuit for comparison of both a read address signal Adr and a write address signal Cnt. FIG. 6 is a schematic of one embodiment of a redundancy compare latch circuit 600. Each redundancy comparator 515 contains at least one redundancy compare latch circuit 600. For one embodiment, each redundancy comparator 515 contains a redundancy compare latch circuit 600 associated with each bit of the column address.

As depicted in FIG. 6, redundancy compare latch circuit 600 includes a mapping latch circuit 605, a read address compare circuit 610, and a write address compare circuit 615. Mapping latch circuit 605 provides a fuse data signal as a first input to each of the read address compare circuit 610 and the write address compare circuit 615. The fuse data signal is indicative of the state of the non-volatile storage device of the mapping circuit commonly used in redundancy schemes. The fuse data signal is further indicative of a known defective address associated with a primary grouping of memory cells. The non-volatile storage devices of the mapping circuit may be flash memory cells. The read address signal Adr is provided as a second input to the read address compare circuit 610 while the write address signal Cnt is provided as a second input to the write address compare circuit 615. When the read address signal Adr matches the fuse data signal, the read address match signal AdrMatch assumes a first logic level, such as logic 1, and when the read address signal Adr differs from the fuse data signal, the read address match signal AdrMatch assumes a second logic level, such as logic 0. Likewise, when the write address signal Cnt matches the fuse data signal, the write address match signal CntMatch assumes a first logic level, such as logic 1, and when the write address signal Cnt differs from the fuse data signal, the write address match signal CntMatch assumes a second logic level, such as logic 0. Each compare circuit 610 and 615 may be an XNOR gate such that inputs having matching logic levels provide a logic 1 at the output while inputs having differing logic levels provide a logic 0 at the output.

Figure 7:
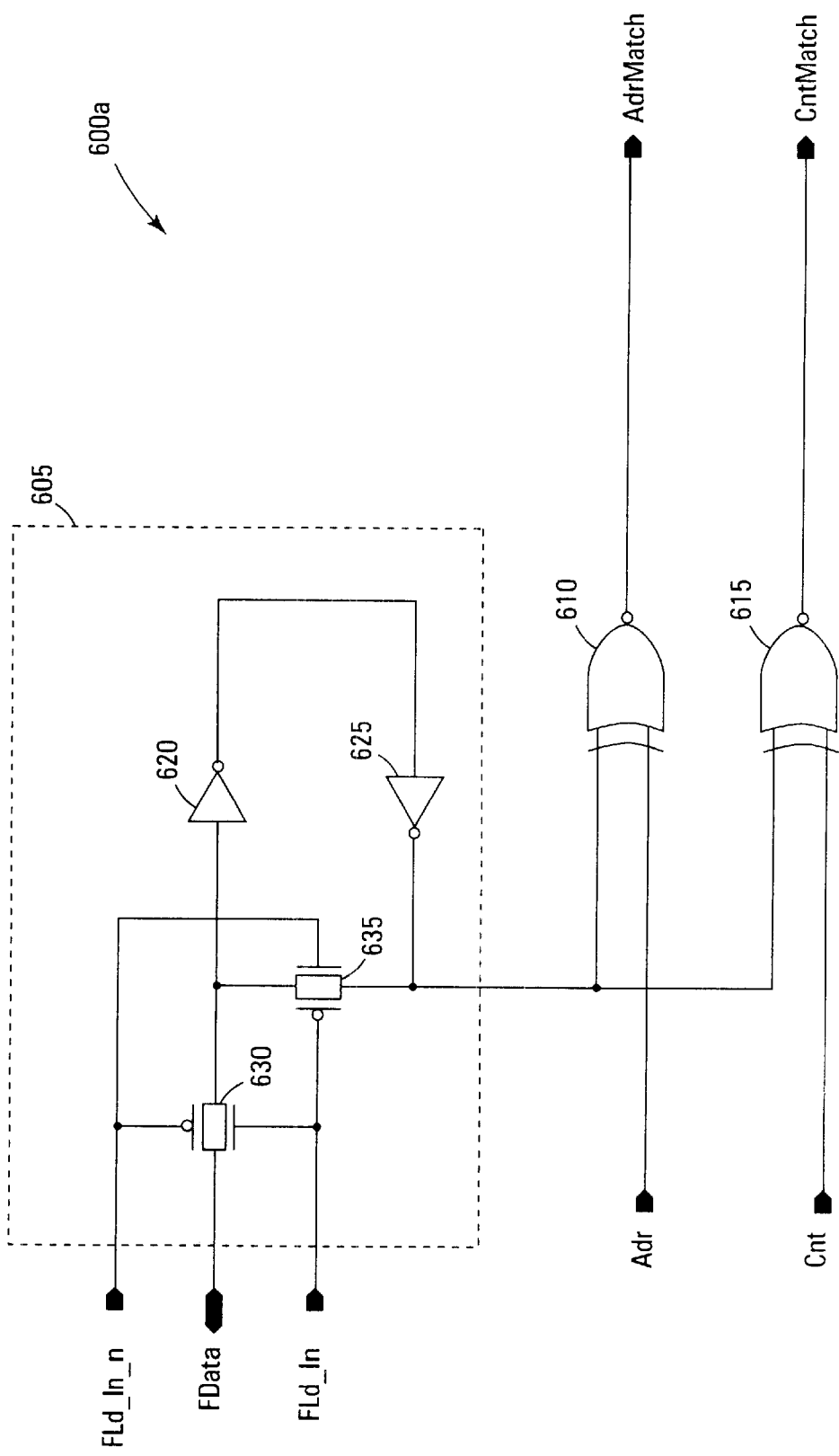
FIG. 7 is a schematic of a redundancy compare latch circuit in accordance with another embodiment of the invention.

FIG. 7 is a schematic of another redundancy compare latch circuit 600. The redundancy compare latch circuit 600a of FIG. 7 includes a mapping latch circuit 605 containing a pair of reverse coupled inverters 620 and 625 to latch the fuse data signal FData. The input of the inverter 625 is coupled to selectively receive the fuse data signal FData or the output of the inverter 620. As shown, the fuse data signal FData is gated by a first selective coupling device, depicted as a complementary metal oxide semiconductor (CMOS) pass gate 630 having an n-channel field effect transistor (nFET) and a p-channel field effect transistor (pFET) coupled in parallel, for input to the reverse coupled inverters 620 and 625. A first source/drain region of the first pass gate 630 is coupled to the signal node providing the fuse data signal FData while a second source/drain region of the first pass gate 630 is coupled to the input of the inverter 620. A second selective coupling device, depicted as a second CMOS pass gate 635, provides for selective isolation of the inverter 625 such that feedback from the output of the inverter 625 does not interfere with an incoming fuse data signal FData. A first source/drain region of the second pass gate 635 is coupled to the input of the inverter 620 while a second source/drain region of the second pass gate 635 is coupled to the output of the inverter 625. The gate of the nFET device of the first pass gate 630 and the gate of the pFET device of the second pass gate 635 are coupled to the signal node providing a control signal, FLd_In. The gate of the pFET device of the first pass gate 630 and the gate of the nFET device of the second pass gate 635 are coupled to the signal node providing a control signal, FLd_In_n, which is the binary complement of the control signal FLd_In. In this manner, the second pass gate 635 will be deactivated when the first pass gate 630 is activated, and vice versa. Thus, the response of the first selective coupling device to the control signal or control signals is opposite the response of the second selective coupling device.

Other selective coupling devices can provide signal gating. For example, the first pass gate 630 could be replaced by an nFET device while the second pass gate 635 could be replaced by a single pFET device to provide the appropriate gating. Providing the same control signal to the gates of the nFET and pFET devices will produce the desired opposite response, i.e., activating one selective coupling device while substantially concurrently deactivating the other. However, the CMOS devices will provide improved signal characteristics, e.g., cleaner transitions between logic states of the gated signal, than a single nFET or pFET transistor.

To load the latch of the reverse coupled inverters 620 and 625 with the logic level of the fuse data signal FData, the first pass gate 630 is activated and the second pass gate 635 is deactivated. Upon subsequent deactivation of the first pass gate 630 and activation of the second pass gate 635, the logic level of the fuse data signal FData is maintained by the latch.

The read compare circuit 610 is depicted as an XNOR gate for providing the read address match signal AdrMatch in response to the fuse data signal FData and the read address signal Adr. The read address match signal AdrMatch has a first logic level, such as logic 1, when the latched fuse data signal matches the read address signal Adr. The signals match when their respective logic levels are the same, e.g., logic 1 and logic 1, or logic 0 and logic 0. The read address match signal AdrMatch has a second logic level, such as logic 0, when the latched fuse data signal differs from the read address signal Adr. The signals differ when their respective logic levels are different, e.g., logic 1 and logic 0, or logic 0 and logic 1. The write compare circuit 615 is depicted as an XNOR gate for providing the write address match signal CntMatch in response to the fuse data signal FData and the write address signal Cnt. The write address match signal CntMatch has a first logic level, such as logic 1, when the latched fuse data signal matches the write address signal Cnt. The signals match when their respective logic levels are the same, e.g., logic 1 and logic 1, or logic 0 and logic 0. The write address match signal CntMatch has a second logic level, such as logic 0, when the latched fuse data signal differs from the write address signal Cnt. The signals differ when their respective logic levels are different, e.g., logic 1 and logic 0, or logic 0 and logic 1.

Figure 8:
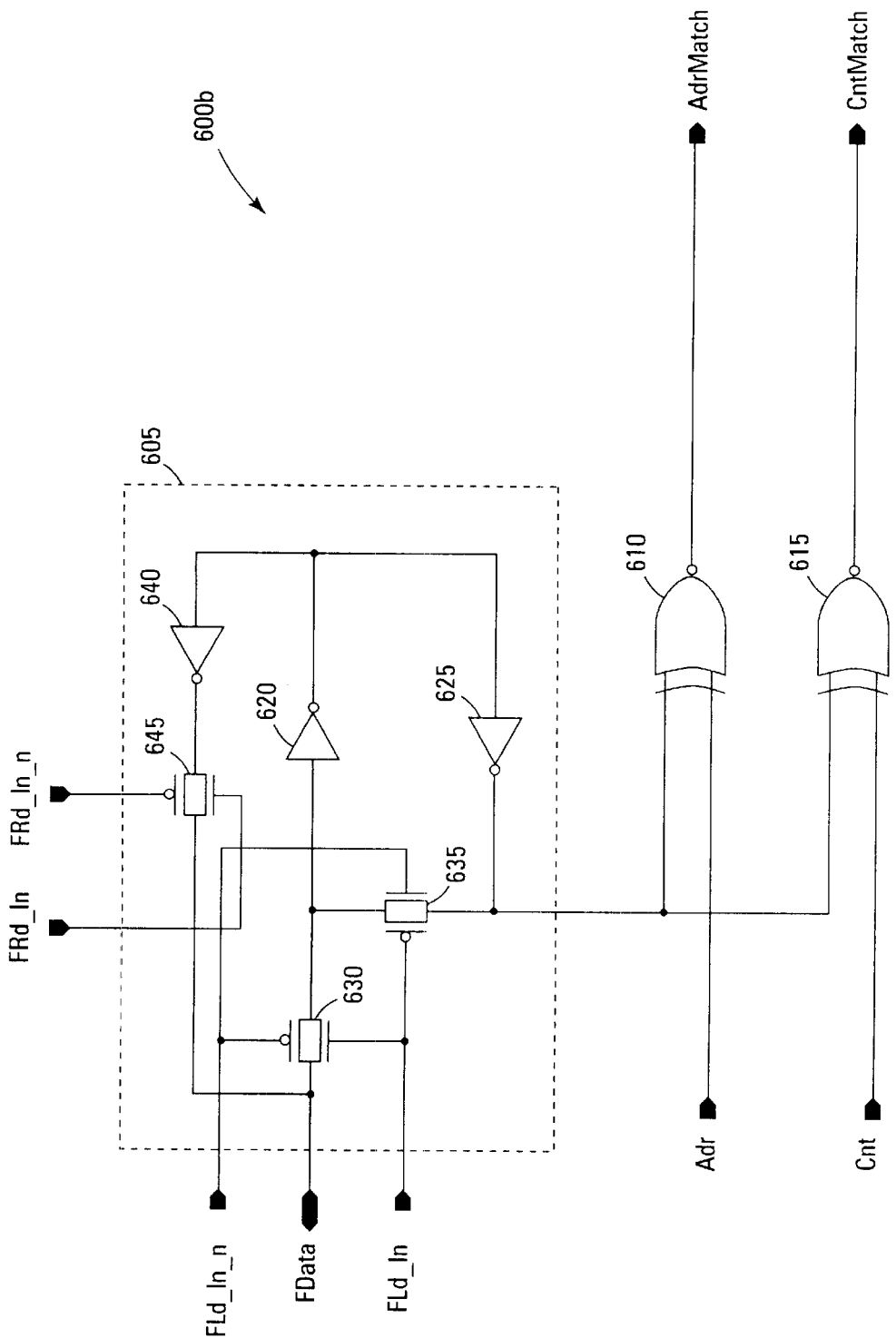
FIG. 8 is a schematic of a redundancy compare latch circuit in accordance with yet another embodiment of the invention.

FIG. 8 is a schematic of another redundancy compare latch circuit 600 in accordance with an embodiment of the invention. The redundancy compare latch circuit 600b of FIG. 8 includes the elements of the redundancy compare latch circuit 600a and further includes additional elements to allow the value of the latched fuse data signal to be read from the mapping latch circuit 605. This feature may be used during testing of a memory device to verify the integrity of the latched fuse data value. The additional elements include an inverter 640 and a third pass gate 645. The inverter 640 is reverse coupled with inverter 620, having its input coupled to the output of the inverter 620. The third pass gate 645 has a first source/drain region coupled to the output of the inverter 640 and a second source/drain region coupled to the signal node providing the fuse data signal FData. The third pass gate 645 has the gate of its nFET device coupled to the signal node providing the control signal FRd__In and the gate of its pFET device coupled to the signal node providing the control signal FRd__In__n, which is the binary complement of the control signal FRd__In. The third pass gate 645 is thus controlled by the control signals FRd__In and FRd__In__n for activation and deactivation. The third pass gate 645 is normally deactivated, or off, during operation of the redundancy compare latch circuit 600b. The third pass gate 645 provides for the selective output of the latched fuse data signal.

Figure 9:
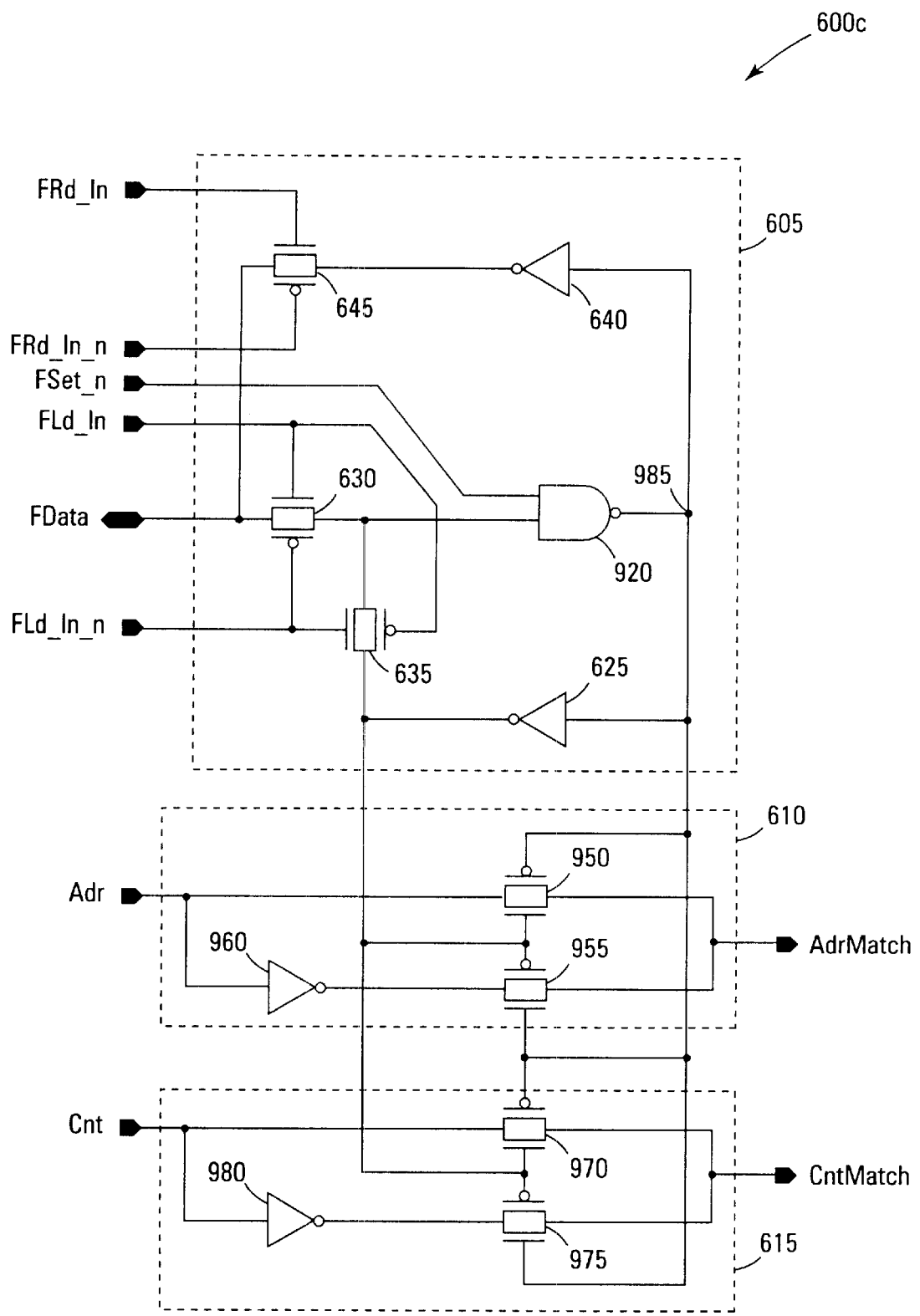
FIG. 9 is a schematic of a redundancy compare latch circuit in accordance with a further embodiment of the invention.

In the redundancy compare latch circuit 600c of FIG. 9, the mapping latch circuit 605 is coupled to a variety of signal nodes for input of control signals and input/output of data signals. In the mapping latch circuit 605 as shown in FIG. 9, a first pass gate 630 provides gating for the fuse data signal FData. A second pass gate 635 provides for selective isolation of the inverter 625. A third pass gate 645 provides for the selective output of the latched fuse data signal. Each of the pass gates is controlled by a first control signal and a second control signal, where the second control signal is the binary complement of the first control signal. As such, the first pass gate 630 has a first control signal, FLd__In, coupled to the gate of its nFET device and a second control signal, FLd__In__n, as a binary complement of the first control signal coupled to the gate of its pFET device. The second pass gate 635 has the first control signal FLd__In coupled to the gate of its pFET device and the second control signal FLd__In__n coupled to the gate of its nFET device. The second pass gate 635 is thus deactivated when the first pass gate 630 is activated, and activated when the first pass gate 630 is deactivated. The third pass gate 645 has a first control signal, FRd__In, coupled to the gate of its nFET device and a second control signal, FRd__In__n, as a binary complement of the first control signal coupled to the gate of its pFET device. As each pass gate is responsive to two control signals that are the binary complements of each other and are acting substantially concurrently, each complementary pair can be deemed to act as a single control signal from a single signal node.

The redundancy compare latch circuit 600c further shows that the inverter 620 may be replaced by a NAND gate 920. The NAND gate 920 has a first input selectively coupled to both the FData node and the output of the inverter 625. The NAND gate 920 has a second input coupled to receive a control signal FSet__n on a signal node. The control signal FSet__n would normally be held at logic 1 during operation of the redundancy compare latch circuit 600c, but may be transitioned to a logic 0 to set or force the value at signal node 985 to a logic level, in this case a logic 1.

The read address compare circuit 610 of redundancy compare latch circuit 600c includes a first pass gate 950, a second pass gate 955 and an inverter 960. The gate of the nFET device of the first pass gate 950 and the gate of the pFET device of the second pass gate 955 are each coupled to the output of the inverter 625 and, thus, the value of the fuse data signal FData. The gate of the pFET device of the first pass gate 950 and the gate of the nFET device of the second pass gate 955 are each coupled to the input of the inverter 625 and, thus, the binary complement of the value of the fuse data signal FData. The first pass gate 950 is coupled to receive the read address signal Adr as an input. The inverter 960 is coupled between the second pass gate 955 and the signal node providing the read address signal Adr. As such, the second pass gate 955 is coupled to receive the binary complement of the read address signal Adr. The outputs of the first pass gate 950 and the second pass gate 955 are each coupled to the signal node for output of the read address match signal AdrMatch.

The write address compare circuit 615 of redundancy compare latch circuit 600c includes a first pass gate 970, a second pass gate 975 and an inverter 960. The gate of the nFET device of the first pass gate 970 and the gate of the pFET device of the second pass gate 975 are each coupled to the output of the inverter 625 and, thus, the value of the fuse data signal FData. The gate of the pFET device of the first pass gate 970 and the gate of the nFET device of the second pass gate 975 are each coupled to the input of the inverter 625 and, thus, the binary complement of the value of the fuse data signal FData. The first pass gate 970 is coupled to receive the write address signal Cnt as an input. The inverter 980 is coupled between the second pass gate 975 and the signal node providing the write address signal Cnt. As such, the second pass gate 975 is coupled to receive the binary complement of the write address signal Cnt. The outputs of the first pass gate 970 and the second pass gate 975 are each coupled to the signal node for output of the write address match signal CntMatch.

Figure 10:
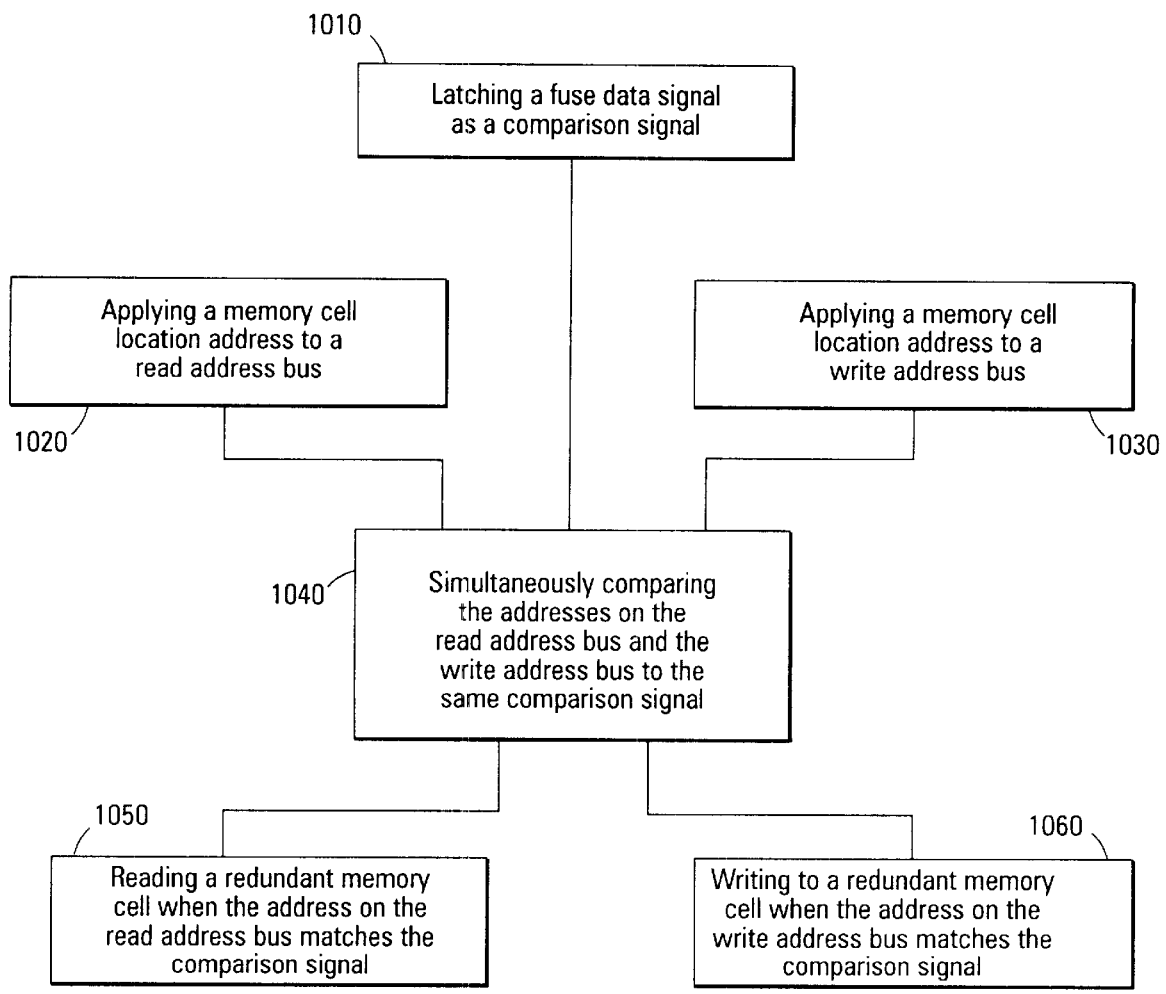
FIG. 10 is a flow chart of a method of operating a memory device for redundancy selection in accordance with an embodiment of the invention.

FIG. 10 depicts a flowchart of a method of operating a memory device for redundancy selection in accordance with an embodiment of the invention. At 1010, a fuse data signal is latched as a comparison signal. The fuse data signal is representative of at least one bit a memory cell location address identified as a known defective memory cell. Note that a known defective memory cell may not be defective itself, but may be otherwise associated with a defective memory cell such that there is a desire to replace it with a redundant memory cell.

At 1020, a memory cell location address is applied to the memory device in association with a read command and thus directed to a read address bus containing read address signals. At 1030, a memory cell location address is applied to the memory device in association with a write command and thus directed to a write address bus containing write address signals. The write address bus is thus separate and distinct from the read address bus. Note that actions 1020 and 1030 need not occur in any particular order.

At 1040, the addresses contained on the read address bus and the write address bus are simultaneously compared to the same comparison signal. At 1050, a redundant memory cell is read if the address on the read address bus matches the comparison signal and at 1060, a redundant memory cell is written to if the address on the write address bus matches the comparison signal. Note that actions 1050 (reading a redundant memory cell) and 1060 (writing to a redundant memory cell) need not occur in any particular order. Note further that action 1060 can begin before action 1050 is complete, even when the primary and redundant memory cells are the same for both the read operation and the write operation.

CONCLUSION

Memory devices having redundancy selection circuitry have been described, with particular reference to synchronous non-volatile memory devices capable of concurrent read and write operations. Such memory devices are suited for high-performance applications. The memory devices include a redundancy comparator for comparing address signals applied to the memory device to known defective address, and for selecting redundant elements if a match is identified. A redundancy comparator includes at least one redundancy compare latch circuit, each redundancy compare latch circuit having a mapping latch circuit, a read address compare circuit coupled to the mapping latch circuit, and a write address compare circuit coupled to the mapping latch circuit. The read address compare circuit and the write address compare circuit thus share the same mapping latch circuit. Such circuits are capable of simultaneously comparing a read address signal and a write address signal, thus facilitating concurrent read and write operations.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A redundancy compare latch circuit, comprising:
   a mapping latch circuit coupled to receive and latch a fuse data signal;
   a read address compare circuit coupled to receive a read address signal and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and
   a write address compare circuit coupled to receive a write address signal and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal.

2. The redundancy compare latch circuit of claim 1, wherein the mapping latch circuit is responsive to a first control signal to load and latch the fuse data signal.

3. The redundancy compare latch circuit of claim 2, wherein the mapping latch circuit is further responsive to a second control signal to output the latched fuse data signal.

4. The redundancy compare latch circuit of claim 2, wherein the mapping latch circuit is further responsive to a second control signal to force the latched fuse data signal to a logic level.

5. The redundancy compare latch circuit of claim 1, wherein the fuse data signal is received from a non-volatile flash memory cell.

6. A redundancy compare latch circuit, comprising:
   a mapping latch circuit coupled to a first signal node, a second signal node, and a third signal node, wherein the mapping latch circuit is responsive to a first control signal on the first signal node to receive and latch a fuse data signal from the second signal node to produce a latched fuse data signal, further wherein the mapping latch circuit is responsive to a second control signal on the third signal node to provide the latched fuse data signal to the second signal node;
   a read address compare circuit coupled to receive a read address signal and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and
   a write address compare circuit coupled to receive a write address signal and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal.

7. A redundancy compare latch circuit, comprising:
   a mapping latch circuit coupled to a first signal node, a second signal node, a third signal node, and a fourth signal node, wherein the mapping latch circuit is responsive to a first control signal on the first signal node to receive and latch a fuse data signal from the second signal node to produce a latched fuse data signal, further wherein the mapping latch circuit is responsive to a second control signal on the third signal node to provide the latched fuse data signal to the second signal node, still further wherein the mapping latch circuit is responsive to a third control signal on the fourth signal node to force the latched fuse data signal to a logic level;
   a read address compare circuit coupled to receive a read address signal and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and
   a write address compare circuit coupled to receive a write address signal and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal.

8. A redundancy compare latch circuit, comprising:
   a first inverter having an input and an output;
   a second inverter having an input and an output, wherein the output of the first inverter is coupled to the input of the second inverter;
   a first field effect transistor of a first polarity and having a gate, a first source/drain region, and a second source/drain region, wherein the first source/drain region is coupled to a first signal node for receiving a fuse data signal, the second source/drain region is coupled to the input of the first inverter, and the gate is coupled to a second signal node for receiving a control signal;
   a second field effect transistor of a second polarity and having a gate, a first source/drain region, and a second source/drain region, wherein the second polarity is opposite the first polarity and wherein the first source/drain region is coupled to the input of the first inverter, the second source/drain region is coupled to the output of the second inverter, and the gate is coupled to the second signal node for receiving the control signal;
   a first XNOR gate having a first input, a second input and an output, wherein the first input is coupled to the output of the second inverter and the second input is coupled to a third signal node for receiving a read address signal, further wherein the output provides a read address match signal having a first logic level when the read address signal matches a logic level at the output of the second inverter and a second logic level when the read address signal differs from the logic level at the output of the second inverter; and a second XNOR gate having a first input, a second input and an output, wherein the first input is coupled to the output of the second inverter and the second input is coupled to a fourth signal node for receiving a write address signal, further wherein the output provides a write address match signal having the first logic level when the write address signal matches the logic level at the output of the second inverter and the second logic level when the write address signal differs from the logic level at the output of the second inverter.

9. A redundancy compare latch circuit, comprising:

a first inverter having an input and an output;

a second inverter having an input and an output, wherein the output of the first inverter is coupled to the input of the second inverter;

a third inverter having an input and an output, wherein the output of the first inverter is coupled to the input of the third inverter;

a first field effect transistor of a first polarity and having a gate, a first source/drain region, and a second source/drain region, wherein the first source/drain region is coupled to a first signal node for receiving a fuse data signal, the second source/drain region is coupled to the input of the first inverter, and the gate is coupled to a second signal node for receiving a control signal;

a second field effect transistor of a second polarity and having a gate, a first source/drain region, and a second source/drain region, wherein the second polarity is opposite the first polarity and wherein the first source/drain region is coupled to the input of the first inverter, the second source/drain region is coupled to the output of the second inverter, and the gate is coupled to the second signal node for receiving the control signal;

a third field effect transistor having a gate, a first source/drain region, and a second source/drain region, wherein the first source/drain region is coupled to the output of the third inverter, the second source/drain region is coupled to the first signal node, and the gate is coupled to the third signal node for receiving a second control signal;

a first XNOR gate having a first input, a second input and an output, wherein the first input is coupled to the output of the second inverter and the second input is coupled to a fourth signal node for receiving a read address signal, further wherein the output provides a read address match signal having a first logic level when the read address signal matches a logic level at the output of the second inverter and a second logic level when the read address signal differs from the logic level at the output of the second inverter; and a second XNOR gate having a first input, a second input and an output, wherein the first input is coupled to the output of the second inverter and the second input is coupled to a fifth signal node for receiving a write address signal, further wherein the output provides a write address match signal having the first logic level when the write address signal matches the logic level at the output of the second inverter and the second logic level when the write address signal differs from the logic level at the output of the second inverter.

10. A redundancy compare latch circuit, comprising:

a mapping latch circuit coupled to a first signal node for receiving a first control signal, a second signal node for receiving a second control signal that is a complement of the first control signal, and a third signal node for receiving a fuse data signal, wherein the mapping latch circuit comprises:

a first inverter having an input and an output;

a second inverter having an input and an output, wherein the output of the first inverter is coupled to the input of the second inverter;

a first pass gate coupled between the third signal node and the input of the first inverter, wherein the first pass gate has a field effect transistor of a first polarity having a gate coupled to the first signal node and a field effect transistor of a second polarity having a gate coupled to the second signal node; and a second pass gate coupled between the output of the second inverter and the input of the first inverter, wherein the second pass gate has a field effect transistor of the first polarity having a gate coupled to the second signal node and a field effect transistor of the second polarity having a gate coupled to the first signal node;

a read address compare circuit having a first input coupled to a fourth signal node to receive a read address signal, a second input coupled to at least the output of the second inverter, and an output, wherein the read address compare circuit provides on its output a read address match signal having a first logic level when the read address signal matches a logic level at the output of the second inverter and a second logic level when the read address signal differs from the logic level at the output of the second inverter; and a write address compare circuit having a first input coupled to a fifth signal node to receive a write address signal, a second input coupled to at least the output of the second inverter, and an output, wherein the write address compare circuit provides on its output a write address match signal having the first logic level when the write address signal matches the logic level at the output of the second inverter and the second logic level when the write address signal differs from the output of the second inverter.

11. The redundancy compare latch circuit of claim 10, wherein the read address compare circuit comprises an XNOR gate having a first input coupled to the output of the second inverter and a second input coupled to the fourth signal node.

12. The redundancy compare latch circuit of claim 10, wherein the write address compare circuit comprises an XNOR gate having a first input coupled to the output of the second inverter and a second input coupled to the fifth signal node.

13. The redundancy compare latch circuit of claim 10, wherein the read address compare circuit further comprises:

an inverter having an input coupled to the first input of the read address compare circuit, and an output;

a first pass gate coupled between the first input and the output of the read address compare circuit, wherein the first pass gate has a field effect transistor of the first polarity having a gate coupled to the output of the second inverter and a field effect transistor of the second polarity having a gate coupled to the input of the second inverter;

a second pass gate coupled between the output of the inverter and the output of the read address compare circuit, wherein the second pass gate has a field effect transistor of the first polarity having a gate coupled to the input of the second inverter and a field effect transistor of the second polarity having a gate coupled to the output of the second inverter.

14. The redundancy compare latch circuit of claim 10, wherein the write address compare circuit further comprises:
   an inverter having an input coupled to the first input of the write address compare circuit, and an output;
   a first pass gate coupled between the first input and the output of the write address compare circuit, wherein the first pass gate has a field effect transistor of the first polarity having a gate coupled to the output of the second inverter and a field effect transistor of the second polarity having a gate coupled to the input of the second inverter;
   a second pass gate coupled between the output of the inverter and the output of the write address compare circuit, wherein the second pass gate has a field effect transistor of the first polarity having a gate coupled to the input of the second inverter and a field effect transistor of the second polarity having a gate coupled to the output of the second inverter.

15. A redundancy compare latch circuit, comprising:
   a mapping latch circuit coupled to a first signal node for receiving a first control signal, a second signal node for receiving a second control signal that is a complement of the first control signal, a third signal node for receiving a third control signal, a fourth signal node for receiving a fourth control signal that is a complement of the third control signal, and a fifth signal node for receiving a fuse data signal, wherein the mapping latch circuit comprises:
      a first inverter having an input and an output;
      a second inverter having an input and an output, wherein the output of the first inverter is coupled to the input of the second inverter;
      a third inverter having an input and an output, wherein the output of the first inverter is coupled to the input of the second inverter;
      a first pass gate coupled between the fifth signal node and the input of the first inverter, wherein the first pass gate has a field effect transistor of a first polarity having a gate coupled to the first signal node and a field effect transistor of a second polarity having a gate coupled to the second signal node;
      a second pass gate coupled between the output of the second inverter and the input of the first inverter, wherein the second pass gate has a field effect transistor of the first polarity having a gate coupled to the second signal node and a field effect transistor of the second polarity having a gate coupled to the first signal node; and
      a third pass gate coupled between the output of the third inverter and the fifth signal node, wherein the third pass gate has a field effect transistor of the first polarity having a gate coupled to the third signal node and a field effect transistor of the second polarity having a gate coupled to the fourth signal node;
   a read address compare circuit having a first input coupled to a sixth signal node to receive a read address signal, a second input coupled to at least the output of the second inverter, and an output, wherein the read address compare circuit provides on its output a read address match signal having a first logic level when the read address signal matches a logic level at the output of the second inverter and a second logic level when the read address signal differs from the logic level at the output of the second inverter; and
   a write address compare circuit having a first input coupled to a seventh signal node to receive a write address signal, a second input coupled to at least the output of the second inverter, and an output, wherein the write address compare circuit provides on its output a write address match signal having the first logic level when the write address signal matches the logic level at the output of the second inverter and the second logic level when the write address signal differs from the output of the second inverter.

16. The redundancy compare latch circuit of claim 15, wherein the read address compare circuit comprises an XNOR gate having a first input coupled to the output of the second inverter and a second input coupled to the sixth signal node.

17. The redundancy compare latch circuit of claim 15, wherein the write address compare circuit comprises an XNOR gate having a first input coupled to the output of the second inverter and a second input coupled to the seventh signal node.

18. The redundancy compare latch circuit of claim 15, wherein the read address compare circuit further comprises:
   an inverter having an input coupled to the first input of the read address compare circuit, and an output;
   a first pass gate coupled between the first input and the output of the read address compare circuit, wherein the first pass gate has a field effect transistor of the first polarity having a gate coupled to the output of the second inverter and a field effect transistor of the second polarity having a gate coupled to the input of the second inverter;
   a second pass gate coupled between the output of the inverter and the output of the read address compare circuit, wherein the second pass gate has a field effect transistor of the first polarity having a gate coupled to the input of the second inverter and a field effect transistor of the second polarity having a gate coupled to the output of the second inverter.

19. The redundancy compare latch circuit of claim 15, wherein the write address compare circuit further comprises:
   an inverter having an input coupled to the first input of the write address compare circuit, and an output;
   a first pass gate coupled between the first input and the output of the write address compare circuit, wherein the first pass gate has a field effect transistor of the first polarity having a gate coupled to the output of the second inverter and a field effect transistor of the second polarity having a gate coupled to the input of the second inverter;
   a second pass gate coupled between the output of the inverter and the output of the write address compare circuit, wherein the second pass gate has a field effect transistor of the first polarity having a gate coupled to the input of the second inverter and a field effect transistor of the second polarity having a gate coupled to the output of the second inverter.

20. A redundancy compare latch circuit, comprising:
   a mapping latch circuit coupled to a first signal node for receiving a first control signal, a second signal node for receiving a second control signal that is a complement of the first control signal, a third signal node for receiving a third control signal, a fourth signal node for receiving a fourth control signal that is a complement of the third control signal, a fifth signal node for receiving a firth control signal, and a sixth signal node for receiving a fuse data signal, wherein the mapping latch circuit comprises:
- a NAND gate having a first input, a second input, and an output, wherein the first input is coupled to the fifth signal node;
- a first inverter having an input and an output, wherein the output of the NAND gate is coupled to the input of the first inverter;
- a second inverter having an input and an output, wherein the output of the NAND gate is coupled to the input of the second inverter;
- a first pass gate coupled between the sixth signal node and the second input of the NAND gate, wherein the first pass gate has a field effect transistor of a first polarity having a gate coupled to the first signal node and a field effect transistor of a second polarity having a gate coupled to the second signal node;
- a second pass gate coupled between the output of the first inverter and the second input of the NAND gate, wherein the second pass gate has a field effect transistor of the first polarity having a gate coupled to the second signal node and a field effect transistor of the second polarity having a gate coupled to the first signal node; and
- a third pass gate coupled between the output of the second inverter and the sixth signal node, wherein the third pass gate has a field effect transistor of the first polarity having a gate coupled to the third signal node and a field effect transistor of the second polarity having a gate coupled to the fourth signal node;

a read address compare circuit having a first input coupled to a seventh signal node to receive a read address signal, a second input coupled to at least the output of the first inverter, and an output, wherein the read address compare circuit provides on its output a read address match signal having a first logic level when the read address signal matches a logic level at the output of the second inverter and a second logic level when the read address signal differs from the logic level at the output of the second inverter; and a write address compare circuit having a first input coupled to an eighth signal node to receive a write address signal, a second input coupled to at least the output of the first inverter, and an output, wherein the write address compare circuit provides on its output a write address match signal having the first logic level when the write address signal matches the logic level at the output of the second inverter and the second logic level when the write address signal differs from the output of the second inverter.

21. A memory device, comprising:
a memory array having at least one primary memory cell and at least one redundant memory cell; and
a comparator coupled to the memory array and having at least one redundancy compare latch circuit, wherein at least one redundancy compare latch circuit comprises a read address compare circuit and a write address compare circuit sharing a mapping latch circuit and wherein comparison of a latched fuse data signal from the mapping latch circuit with a read address signal by the read address compare circuit and with a write address signal by the write address compare circuit can occur simultaneously.

22. The memory device of claim 21, wherein the memory array comprises an array of non-volatile flash memory cells.

23. The memory device of claim 21, further comprising a mapping circuit coupled to the mapping latch circuit, wherein the mapping circuit provides a fuse data signal to the mapping latch circuit for production of the latched fuse data signal.

24. The memory device of claim 23, wherein the mapping circuit comprises a plurality of non-volatile storage devices.

25. The memory device of claim 24, wherein the plurality of non-volatile storage devices comprises a plurality of non-volatile flash memory cells.

26. The memory device of claim 21, wherein the memory array comprises an array of non-volatile flash memory cells.

27. A memory device, comprising:
an array of memory cells having at least one primary memory cell and at least one redundant memory cell; and
a comparator coupled to the array of memory cells and having a redundancy compare latch circuit, wherein the redundancy compare latch circuit comprises a read address compare circuit and a write address compare circuit sharing a mapping latch circuit;
wherein the mapping latch circuit is associated with a first redundant memory cell and is coupled to receive and latch a fuse data signal indicative of an address of a known defective primary memory cell;
wherein the read address compare circuit provides a read address match signal having a first logic level when a read address signal matches the latched fuse data signal and a second logic level when the read address signal differs from the latched fuse data signal;
wherein the write address compare circuit provides a write address match signal having the first logic level when a write address signal matches the latched fuse data signal and the second logic level when the write address signal differs from the latched fuse data signal;
wherein read access to the known defective memory cell is permitted when the read address match signal has the second logic level and read access to the known defective memory cell is redirected to the first redundant memory cell when the read address match signal has the first logic level; and
wherein write access to the known defective memory cell is permitted when the write address match signal has the second logic level and write access to the known defective memory cell is redirected to the first redundant memory cell when the write address match signal has the first logic level.

28. A memory device, comprising:
a memory array having at least one primary grouping of memory cells and at least one redundant grouping of memory cells; and
a comparator coupled to the memory array and having at least one redundancy compare latch circuit, wherein at least one redundancy compare latch circuit comprises a read address compare circuit and a write address compare circuit sharing a mapping latch circuit and wherein comparison of a latched fuse data signal from the mapping latch circuit with a read address signal by the read address compare circuit and with a write address signal by the write address compare circuit can occur simultaneously.

29. A memory device, comprising:
a memory array having at least one primary grouping of memory cells and at least one redundant grouping of memory cells; and a comparator coupled to the memory array and having at least one redundancy compare latch circuit, wherein at least one redundancy compare latch circuit comprises a read address compare circuit and a write address compare circuit sharing a mapping latch circuit;

wherein the mapping latch circuit is associated with a first redundant grouping of memory cells and is coupled to receive and latch a fuse data signal indicative of a known defective address associated with a first primary grouping of memory cells;

wherein the read address compare circuit provides a read address match signal having a first logic level when the read address signal matches the latched fuse data signal and a second logic level when the read address signal differs from the latched fuse data signal;

wherein the write address compare circuit provides a write address match signal having the first logic level when the write address signal matches the latched fuse data signal and the second logic level when the write address signal differs from the latched fuse data signal;

wherein read access to the first primary grouping of memory cells is permitted when the read address match signal has the second logic level and read access to the first primary grouping of memory cells is redirected to the first redundant grouping of memory cells when the read address match signal has the first logic level; and wherein write access to the first primary grouping of memory cells is permitted when the write address match signal has the second logic level and write access to the first primary grouping of memory cells is redirected to the first redundant grouping of memory cells when the write address match signal has the first logic level.

30. A memory device, comprising:

a memory array having at least one primary grouping of memory cells and at least one redundant grouping of memory cells; and a comparator coupled to the memory array and having at least one redundancy compare latch circuit, wherein each redundancy compare latch circuit comprises:

a mapping latch circuit coupled to receive and latch a fuse data signal;

a read address compare circuit coupled to receive a read address signal associated with a first primary grouping of memory cells and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and a write address compare circuit coupled to receive a write address signal associated with a second primary grouping of memory cells and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal;

wherein access to the first primary grouping of memory cells is permitted when each read address match signal has the second logic level and access to the first primary grouping of memory cells is redirected to a redundant grouping of memory cells when each read address match signal has the first logic level; and wherein access to the second primary grouping of memory cells is permitted when each write address match signal has the second logic level and access to the second primary grouping of memory cells is redirected to a redundant grouping of memory cells when each write address match signal has the first logic level.

31. The memory device of claim 30, wherein the mapping latch circuit is responsive to a first control signal to load and latch the fuse data signal.

32. The memory device of claim 31, wherein the mapping latch circuit is further responsive to a second control signal to output the latched fuse data signal.

33. The memory device of claim 31, wherein the mapping latch circuit is further responsive to a second control signal to force the latched fuse data signal to a logic level.

34. A flash memory device, comprising:

an array of non-volatile flash memory cells having at least one primary memory cell and at least one redundant memory cell;

a comparator coupled to the array of non-volatile flash memory cells and having at least one redundancy compare latch circuit, at least one redundancy compare latch circuit comprising a read address compare circuit and a write address compare circuit sharing a mapping latch circuit; and a mapping circuit coupled to the mapping latch circuit and comprising a plurality of non-volatile storage devices;

wherein the mapping latch circuit detects and latches a state of the plurality of non-volatile storage devices of the mapping circuit to produce a latched fuse data signal; and wherein comparison of the latched fuse data signal with a read address signal by the read address compare circuit and with a write address signal by the write address compare circuit can occur simultaneously.

35. The flash memory device of claim 34, wherein the plurality of non-volatile storage devices comprises a plurality of non-volatile flash memory cells.

36. A flash memory device, comprising:

an array of non-volatile flash memory cells having at least one primary flash memory cell and at least one redundant flash memory cell;

a comparator coupled to the array of non-volatile flash memory cells and having a redundancy compare latch circuit, wherein the redundancy compare latch circuit comprises a read address compare circuit and a write address compare circuit sharing a mapping latch circuit; and a mapping circuit coupled to the mapping latch circuit and comprising a plurality of non-volatile storage devices;

wherein the mapping latch circuit is associated with a first redundant flash memory cell;

wherein the mapping latch circuit detects and latches a state of the plurality of non-volatile storage devices of the mapping circuit to produce a latched fuse data signal;

wherein the read address compare circuit provides a read address match signal having a first logic level when a read address signal matches the latched fuse data signal and a second logic level when the read address signal differs from the latched fuse data signal;

wherein the write address compare circuit provides a write address match signal having the first logic level when a write address signal matches the latched fuse data signal and the second logic level when the write address signal differs from the latched fuse data signal;

wherein read access to a primary flash memory cell associated with the read address signal is redirected to the first redundant flash memory cell when the read address match signal has the first logic level; and wherein write access to a primary flash memory cell associated with the write address is redirected to the first redundant flash memory cell when the write address match signal has the first logic level.

37. A flash memory device, comprising:

an array of non-volatile flash memory cells having at least one primary grouping of flash memory cells and at least one redundant grouping of flash memory cells;

a comparator coupled to the array of non-volatile flash memory cells and having at least one redundancy compare latch circuit, wherein at least one redundancy compare latch circuit comprises a read address compare circuit and a write address compare circuit sharing a mapping latch circuit; and a mapping circuit coupled to the mapping latch circuit and comprising a plurality of non-volatile storage devices;

wherein the mapping latch circuit detects and latches a state of the plurality of non-volatile storage devices of the mapping circuit to produce a latched fuse data signal; and wherein comparison of the latched fuse data signal with a read address signal by the read address compare circuit and with a write address signal by the write address compare circuit can occur simultaneously.

38. A flash memory device, comprising:

an array of non-volatile flash memory cells having at least one primary grouping of flash memory cells and at least one redundant grouping of flash memory cells;

a comparator coupled to the array of non-volatile flash memory cells and having at least one redundancy compare latch circuit, wherein at least one redundancy compare latch circuit comprises a read address compare circuit and a write address compare circuit sharing a mapping latch circuit; and a mapping circuit coupled to the mapping latch circuit and comprising a plurality of non-volatile storage devices;

wherein the mapping latch circuit is associated with a first redundant grouping of flash memory cells;

wherein the mapping latch circuit detects and latches a state of the plurality of non-volatile storage devices of the mapping circuit to produce a latched fuse data signal;

wherein the read address compare circuit provides a read address match signal having a first logic level when a read address signal matches the latched fuse data signal and a second logic level when the read address signal differs from the latched fuse data signal;

wherein the write address compare circuit provides a write address match signal having the first logic level when a write address signal matches the latched fuse data signal and the second logic level when the write address signal differs from the latched fuse data signal;

wherein read access to a primary grouping of flash memory cells associated with the read address signal is redirected to the first redundant grouping of flash memory cells when the read address match signal has the first logic level; and wherein write access to a primary grouping of flash memory cells associated with the write address is redirected to the first redundant grouping of flash memory cells when the write address match signal has the first logic level.

39. A synchronous flash memory device, comprising:

an array of non-volatile flash memory cells having at least one primary grouping of memory cells and at least one redundant grouping of memory cells;

a command execution logic coupled to the array of non-volatile flash memory cells for receiving at least a system clock input signal and for generating commands to control operations performed on the array of non-volatile flash memory cells, wherein the commands are synchronized to the system clock input signal; and a comparator coupled to the array of non-volatile flash memory cells and having at least one redundancy compare latch circuit, wherein each redundancy compare latch circuit comprises:

a mapping latch circuit coupled to receive and latch a fuse data signal;

a read address compare circuit coupled to receive a read address signal associated with a first primary grouping of memory cells and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and a write address compare circuit coupled to receive a write address signal associated with a second primary grouping of memory cells and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal;

wherein access to the first primary grouping of memory cells is permitted when each read address match signal has the second logic level and access to the first primary grouping of memory cells is redirected to a redundant grouping of memory cells when each read address match signal has the first logic level; and wherein access to the second primary grouping of memory cells is permitted when each write address match signal has the second logic level and access to the second primary grouping of memory cells is redirected to a redundant grouping of memory cells when each write address match signal has the first logic level.

40. The synchronous flash memory device of claim 39, wherein the mapping latch circuit is responsive to a first control signal to load and latch the fuse data signal.

41. The synchronous flash memory device of claim 40, wherein the mapping latch circuit is further responsive to a second control signal to output the latched fuse data signal.

42. The synchronous flash memory device of claim 40, wherein the mapping latch circuit is further responsive to a second control signal to force the latched fuse data signal to a logic level.

43. The synchronous flash memory device of claim 40, wherein the first primary grouping of memory cells and the second primary grouping of memory cells are the same primary grouping of memory cells.

44. A memory assembly, comprising:
a memory package having a plurality of interconnects; and
a memory device contained in the memory package, wherein the memory device comprises:
  a memory array having at least one primary memory cell and at least one redundant memory cell;
  a comparator coupled to the memory array and having at least one redundancy compare latch circuit, wherein at least one redundancy compare latch circuit comprises a read address compare circuit and a write address compare circuit sharing a mapping latch circuit and wherein comparison of a latched fuse data signal from the mapping latch circuit with a read address signal by the read address compare circuit and with a write address signal by the write address compare circuit can occur simultaneously;
  address inputs coupled between the memory array and a first portion of the plurality of interconnects of the memory package; and
  data inputs/outputs coupled between the memory array and a second portion of the plurality of interconnects of the memory package.

45. The memory assembly of claim 44, wherein the memory array comprises an array of non-volatile flash memory cells.

46. A synchronous flash memory assembly, comprising:
a memory package having a plurality of interconnects; and
a synchronous flash memory device contained in the memory package, wherein the synchronous flash memory device comprises:
  an array of non-volatile flash memory cells having at least one primary memory cell and at least one redundant memory cell;
  a comparator coupled to the array of non-volatile flash memory cells and having at least one redundancy compare latch circuit, at least one redundancy compare latch circuit comprising a read address compare circuit and a write address compare circuit sharing a mapping latch circuit;
  a mapping circuit coupled to the mapping latch circuit and comprising a plurality of non-volatile storage devices;
  address inputs coupled between the array of non-volatile flash memory cells and a first portion of the plurality of interconnects of the memory package;
  data inputs/outputs coupled between the array of non-volatile flash memory cells and a second portion of the plurality of interconnects of the memory package;
  power inputs coupled between the array of non-volatile flash memory cells and a third portion of the plurality of interconnects of the memory package;
  clock and control signal inputs coupled between the array of non-volatile flash memory cells and a fourth portion of the plurality of interconnects of the memory package; and
  a command execution logic coupled to the array of non-volatile flash memory cells for receiving at least a system clock input signal from the clock and control signal inputs and for generating commands to control operations performed on the array of non-volatile flash memory cells synchronized to the system clock input signal;
  wherein the mapping latch circuit detects and latches a state of the plurality of non-volatile storage devices of the mapping circuit to produce a latched fuse data signal; and
  wherein comparison of the latched fuse data signal with a read address signal by the read address compare circuit and with a write address signal by the write address compare circuit can occur simultaneously.

47. The synchronous flash memory assembly of claim 46, wherein the plurality of interconnects comprises a plurality of interconnect pins having a pin layout substantially similar to an industry standard SDRAM TSOP pin layout.

48. The synchronous flash memory assembly of claim 46, wherein the plurality of interconnects comprises a plurality of bump connections having a bump layout substantially similar to an industry standard SDRAM FBGA bump layout.

49. A synchronous flash memory assembly, comprising:
a memory package having a plurality of interconnects; and
a synchronous flash memory device contained in the memory package, wherein the synchronous flash memory device comprises:
  an array of non-volatile flash memory cells having at least one primary grouping of memory cells and at least one redundant grouping of memory cells; and
  a comparator coupled to the array of non-volatile flash memory cells and having at least one redundancy compare latch circuit, wherein each redundancy compare latch circuit comprises:
    a mapping latch circuit coupled to receive and latch a fuse data signal;
    a read address compare circuit coupled to receive a read address signal associated with a first primary grouping of memory cells and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and
    a write address compare circuit coupled to receive a write address signal associated with a second primary grouping of memory cells and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal;
  address inputs coupled between the array of non-volatile flash memory cells and a first portion of the plurality of interconnects of the memory package;
  data inputs/outputs coupled between the array of non-volatile flash memory cells and a second portion of the plurality of interconnects of the memory package;
  power inputs coupled between the array of non-volatile flash memory cells and a third portion of the plurality of interconnects of the memory package;
  clock and control signal inputs coupled between the array of non-volatile flash memory cells and a fourth portion of the plurality of interconnects of the memory package; and
  a command execution logic coupled to the array of non-volatile flash memory cells for receiving at least a system clock input signal from the clock and control signal inputs and for generating commands to control operations performed on the array of non-volatile flash memory cells synchronized to the system clock input signal.

50. The synchronous flash memory assembly of claim 49, wherein the plurality of interconnects comprises a plurality of interconnect pins having a pin layout substantially similar to an industry standard SDRAM TSOP pin layout.

51. The synchronous flash memory assembly of claim 49, wherein the plurality of interconnects comprises a plurality of bump connections having a bump layout substantially similar to an industry standard SDRAM FBGA bump layout.

52. A method of operating a memory device for redundancy selection, comprising:
   latching a fuse data signal as a comparison signal;
   applying a memory cell location address to the memory device in association with a read command, thereby generating a read address signal, wherein the read address signal is indicative of a first primary memory cell;
   directing the read address signal to a read address bus;
   applying a memory cell location address to the memory device in association with a write command, thereby generating a write address signal, wherein the write address signal is indicative of a second primary memory cell;
   directing the write address signal to a write address bus, wherein the write address bus is separate and distinct from the read address bus;
   simultaneously comparing the read address signal and the write address signal to the comparison signal;
   reading a first redundant memory cell in place of the first primary memory cell when the read address signal matches the comparison signal; and
   writing to a second redundant memory cell in place of the second primary memory cell when the write address signal matches the comparison signal.

53. The method of claim 52, wherein the method is performed in the order presented.

54. The method of claim 52, further comprising:
   wherein the first primary memory cell and the second primary memory cell are the same primary memory cell;
   wherein the first redundant memory cell and the second redundant memory cell are the same redundant memory cell; and
   wherein writing to the second redundant memory cell begins before reading the second redundant memory cell is completed.

55. An electronic system, comprising:
   a processor; and
   a memory device coupled to the processor, wherein the memory device comprises:
      a memory array having at least one primary memory cell and at least one redundant memory cell;
      a comparator coupled to the memory array and having at least one redundancy compare latch circuit, wherein at least one redundancy compare latch circuit comprises a read address compare circuit and a write address compare circuit sharing a mapping latch circuit and wherein comparison of a latched fuse data signal from the mapping latch circuit with a read address signal by the read address compare circuit and with a write address signal by the write address compare circuit can occur simultaneously;
      a plurality of address inputs coupled between the processor and the memory array; and
      a plurality of data inputs/outputs coupled between the processor and the memory array.

56. An electronic system, comprising:
   a processor; and
   a memory device coupled to the processor, wherein the memory device comprises:
      an array of memory cells having at least one primary memory cell and at least one redundant memory cell;
      a comparator coupled to the array of memory cells and having a redundancy compare latch circuit, wherein the redundancy compare latch circuit comprises a read address compare circuit and a write address compare circuit sharing a mapping latch circuit;
      a plurality of address inputs coupled between the processor and the array of memory cells; and
      a plurality of data inputs/outputs coupled between the processor and the array of memory cells;
   wherein the mapping latch circuit is associated with a first redundant memory cell and is coupled to receive and latch a fuse data signal indicative of an address of a known defective primary memory cell;
   wherein the read address compare circuit provides a read address match signal having a first logic level when a read address signal from the processor matches the latched fuse data signal and a second logic level when the read address signal differs from the latched fuse data signal;
   wherein the write address compare circuit provides a write address match signal having the first logic level when a write address signal from the processor matches the latched fuse data signal and the second logic level when the write address signal differs from the latched fuse data signal;
   wherein read access to the known defective memory cell is permitted when the read address match signal has the second logic level and read access to the known defective memory cell is redirected to the first redundant memory cell when the read address match signal has the first logic level; and
   wherein write access to the known defective memory cell is permitted when the write address match signal has the second logic level and write access to the known defective memory cell is redirected to the first redundant memory cell when the write address match signal has the first logic level.

57. An electronic system, comprising:
   a processor; and
   a flash memory device coupled to the processor, wherein the flash memory device comprises:
      an array of non-volatile flash memory cells having at least one primary memory cell and at least one redundant memory cell;
      a comparator coupled to the array of non-volatile flash memory cells and having at least one redundancy compare latch circuit, at least one redundancy compare latch circuit comprising a read address compare circuit and a write address compare circuit sharing a mapping latch circuit;
      a mapping circuit coupled to the mapping latch circuit and comprising a plurality of non-volatile storage devices;
      a plurality of address inputs coupled between the processor and the array of non-volatile flash memory cells; and
      a plurality of data inputs/outputs coupled between the processor and the array of non-volatile flash memory cells;
   wherein the mapping latch circuit detects and latches a state of the plurality of non-volatile storage devices of the mapping circuit to produce a latched fuse data signal; and wherein comparison of the latched fuse data signal with a read address signal by the read address compare circuit and with a write address signal by the write address compare circuit can occur simultaneously.

58. An electronic system, comprising:
a processor; and
a flash memory device coupled to the processor, wherein the flash memory device comprises:
    an array of non-volatile flash memory cells having at least one primary flash memory cell and at least one redundant flash memory cell;
    a comparator coupled to the array of non-volatile flash memory cells and having a redundancy compare latch circuit, wherein the redundancy compare latch circuit comprises a read address compare circuit and a write address compare circuit sharing a mapping latch circuit;
    a mapping circuit coupled to the mapping latch circuit and comprising a plurality of non-volatile storage devices;
    a plurality of address inputs coupled between the processor and the array of non-volatile flash memory cells; and
    a plurality of data inputs/outputs coupled between the processor and the array of non-volatile flash memory cells;
wherein the mapping latch circuit is associated with a first redundant flash memory cell;
wherein the mapping latch circuit detects and latches a state of the plurality of non-volatile storage devices of the mapping circuit to produce a latched fuse data signal;
wherein the read address compare circuit provides a read address match signal having a first logic level when a read address signal matches the latched fuse data signal and a second logic level when the read address signal differs from the latched fuse data signal;
wherein the write address compare circuit provides a write address match signal having the first logic level when a write address signal matches the latched fuse data signal and the second logic level when the write address signal differs from the latched fuse data signal;
wherein read access to a primary flash memory cell associated with the read address signal is redirected to the first redundant flash memory cell when the read address match signal has the first logic level; and
wherein write access to a primary flash memory cell associated with the write address is redirected to the first redundant flash memory cell when the write address match signal has the first logic level.

59. An electronic system, comprising:
a processor; and
a synchronous flash memory device coupled to the processor, wherein the synchronous flash memory device comprises:
    an array of non-volatile flash memory cells having at least one primary grouping of memory cells and at least one redundant grouping of memory cells;
    a comparator coupled to the array of non-volatile flash memory cells and having at least one redundancy compare latch circuit, wherein each redundancy compare latch circuit comprises:
        a mapping latch circuit coupled to receive and latch a fuse data signal;
        a read address compare circuit coupled to receive a read address signal associated with a first primary grouping of memory cells and further coupled to the mapping latch circuit to receive the latched fuse data signal, wherein the read address compare circuit provides a read address match signal having a first logic level when the read address signal matches the latched fuse data signal and a second logic level when the read address signal differs from the latched fuse data signal; and
        a write address compare circuit coupled to receive a write address signal associated with a second primary grouping of memory cells and further coupled to the mapping latch circuit to receive the latched fuse data signal, wherein the write address compare circuit provides a write address match signal having the first logic level when the write address signal matches the latched fuse data signal and the second logic level when the write address signal differs from the latched fuse data signal;
    a plurality of address inputs coupled between the processor and the array of non-volatile flash memory cells;
    a plurality of data inputs/outputs coupled between the processor and the array of non-volatile flash memory cells;
    power inputs coupled between the memory array and a third portion of the plurality of interconnects of the memory package;
    clock and control signal inputs coupled between the memory array and a fourth portion of the plurality of interconnects of the memory package; and
    a command execution logic coupled to the array of non-volatile flash memory cells for receiving at least a system clock input signal through the clock and control signal inputs and for generating commands to control operations performed on the array of non-volatile flash memory cells, wherein the commands are synchronized to the system clock;
wherein access to the first primary grouping of memory cells is redirected to a redundant grouping of memory cells when the read address match signal has the first logic level; and
wherein access to the second primary grouping of memory cells is permitted when each write address match signal has the second logic level and access to the second primary grouping of memory cells is redirected to a redundant grouping of memory cells when the write address match signal has the first logic level.

60. A redundancy compare latch circuit, comprising:
a first inverter having an input and an output;
a second inverter having an input and an output, wherein the output of the first inverter is coupled to the input of the second inverter;
a first selective coupling device coupled between a first signal node and the input of the first inverter, wherein the first selective coupling device is coupled to receive a fuse data signal from the first signal node and to selectively provide the fuse data signal to the input of the first inverter in response to a control signal;
a second selective coupling device coupled between the input of the first inverter and the output of the second inverter, wherein the second selective coupling device is coupled to selectively isolate the output of the second inverter from the input of the first inverter in response to the control signal, and wherein a response of the second selective coupling device to the control signal is opposite a response of the first selective coupling device to the control signal;

a first XNOR gate having a first input, a second input and an output, wherein the first input is coupled to the output of the second inverter and the second input is coupled to a third signal node for receiving a read address signal, further wherein the output provides a read address match signal having a first logic level when the read address signal matches a logic level at the output of the second inverter and a second logic level when the read address signal differs from the logic level at the output of the second inverter; and a second XNOR gate having a first input, a second input and an output, wherein the first input is coupled to the output of the second inverter and the second input is coupled to a fourth signal node for receiving a write address signal, further wherein the output provides a write address match signal having the first logic level when the write address signal matches the logic level at the output of the second inverter and the second logic level when the write address signal differs from the logic level at the output of the second inverter.

61. A redundancy compare latch circuit, comprising:

a first inverter having an input and an output;

a second inverter having an input and an output, wherein the output of the first inverter is coupled to the input of the second inverter;

a third inverter having an input and an output, wherein the output of the first inverter is coupled to the input of the third inverter;

a first selective coupling device coupled between a first signal node and the input of the first inverter, wherein the first selective coupling device is coupled to receive a fuse data signal from the first signal node and to selectively provide the fuse data signal to the input of the first inverter in response to a first control signal;

a second selective coupling device coupled between the input of the first inverter and the output of the second inverter, wherein the second selective coupling device is coupled to selectively isolate the output of the second inverter from the input of the first inverter in response to the first control signal, and wherein a response of the second selective coupling device to the first control signal is opposite a response of the first selective coupling device to the first control signal;

a third selective coupling device coupled between the output of the third inverter and the first signal node, wherein the third selective coupling device is coupled to selectively provide the latched fuse data signal to the first signal node in response to a second control signal;

a first XNOR gate having a first input, a second input and an output, wherein the first input is coupled to the output of the second inverter and the second input is coupled to a fourth signal node for receiving a read address signal, further wherein the output provides a read address match signal having a first logic level when the read address signal matches a logic level at the output of the second inverter and a second logic level when the read address signal differs from the logic level at the output of the second inverter; and a second XNOR gate having a first input, a second input and an output, wherein the first input is coupled to the output of the second inverter and the second input is coupled to a fifth signal node for receiving a write address signal, further wherein the output provides a write address match signal having the first logic level when the write address signal matches the logic level at the output of the second inverter and the second logic level when the write address signal differs from the logic level at the output of the second inverter.

* * * * *

UNITED STATES PATENT AND TRADEMARK OFFICE
CERTIFICATE OF CORRECTION

PATENT NO. : 6,504,768 B1
DATED : January 7, 2003
INVENTOR(S) : Frankie F. Roohparvar and Ebrahim Abedifard It is certified that error appears in the above-identified patent and that said Letters Patent is hereby corrected as shown below:

Title page,
Item [*] Notice, replace "90 days" with -- 245 days --

Column 19,
Line 39, replace "of the second inverter;" with -- of the third inverter --

Column 21,
Line 1, replace "receiving a firth control" with -- receiving a fifth control --

Signed and Sealed this

Seventeenth Day of February, 2004

JON W. DUDAS
*Acting Director of the United States Patent and Trademark Office*